United States Patent
Harrison et al.

(10) Patent No.: US 6,900,021 B1
(45) Date of Patent: May 31, 2005

(54) MICROFLUIDIC SYSTEM AND METHODS OF USE

(75) Inventors: Daniel Jed Harrison, Edmonton (CA); Per Andersson, Edmonton (CA); Paul C. H. Li, Laguna (HK); Roderick Szarka, Edmonton (CA); Richard Smith, Edmonton (CA); Hossein Salimi-Moosavi, Edmonton (CA)

(73) Assignee: The University of Alberta, Alberta (CA)

( * ) Notice: Subject to any disclaimer, the term of this patent is extended or adjusted under 35 U.S.C. 154(b) by 0 days.

(21) Appl. No.: 09/080,546

(22) Filed: May 18, 1998

Related U.S. Application Data

(63) Continuation-in-part of application No. 08/858,087, filed on May 16, 1997.
(60) Provisional application No. 60/047,024, filed on May 19, 1997.

(51) Int. Cl.[7] .............................................. G01N 33/554
(52) U.S. Cl. .................... 435/7.21; 422/81; 422/73; 422/68.1; 422/101; 435/7.24; 435/288.2; 435/288.5; 436/514; 436/52; 436/63; 436/164; 436/518
(58) Field of Search .......................... 137/806; 436/52, 436/63, 518, 164, 514; 422/81, 101, 68.1, 73; 424/278.1; 435/32, 309.1, 286.1, 288, 7.24, 7.21, 288.2, 288.5; 280/461

(56) References Cited

U.S. PATENT DOCUMENTS

| | | |
|---|---|---|
| 4,399,225 A | 8/1983 | Hansen et al. |
| 4,504,443 A | 3/1985 | Hansen et al. |
| 4,676,274 A | 6/1987 | Brown |
| 4,729,949 A | 3/1988 | Weinreb et al. |
| 4,973,561 A | 11/1990 | Hansen et al. |
| 4,987,084 A | 1/1991 | Tedder |
| 5,149,972 A | 9/1992 | Fay et al. |
| 5,180,662 A | 1/1993 | Sitkovsky |
| 5,310,674 A | 5/1994 | Weinreb et al. |
| 5,460,945 A | 10/1995 | Springer et al. |
| 5,496,697 A * | 3/1996 | Parce ............................ 435/5 |
| 5,506,141 A | 4/1996 | Weinreb et al. |
| 5,585,103 A * | 12/1996 | Raychaudhuri et al. .. 424/278.1 |
| 5,587,128 A | 12/1996 | Wilding et al. |
| 5,750,015 A | 5/1998 | Soane et al. |
| 5,773,298 A | 6/1998 | Lynggaard et al. |

(Continued)

FOREIGN PATENT DOCUMENTS

| | | |
|---|---|---|
| EP | 0 616 218 | 9/1994 |
| WO | 92/03734 | 3/1992 |
| WO | 93/22053 | 11/1993 |

(Continued)

OTHER PUBLICATIONS

Li et al. (Apr. 15, 1997). Transport, manipulation, and reaction of biological cells on chip using electrokenetic effects. Anal. Chem. 69:1564–1568.*

White, AJ. et al, Biochem. J., vol. 306 (pt 3), p 843–9, (abstract only), Mar. 1995.*

Andersson, PE, et al., "Biological Cell Assays on an Electrokinetic Microchip", publication unknown, publication date unknown.

(Continued)

*Primary Examiner*—Christopher L. Chin
(74) *Attorney, Agent, or Firm*—Bereskin & Parr

(57) ABSTRACT

This invention relates to a novel microfluidic device and methods of using this device to conduct in vitro studies on the reaction and effects of various compounds on cells. More particularly, it relates to a method for using stop flow in a microfluidic system to study the effect of compounds on individual cells. It also provides a method for observing the effects of candidate compounds on leukocyte rolling.

7 Claims, 12 Drawing Sheets

U.S. PATENT DOCUMENTS

| | | | |
|---|---|---|---|
| 5,776,748 A | | 7/1998 | Singhvi et al. |
| 5,804,436 A | | 9/1998 | Okun et al. |
| 5,810,985 A | * | 9/1998 | Bao et al. ............ 204/451 |
| 5,858,195 A | | 1/1999 | Ramsey |
| 5,858,648 A | | 1/1999 | Steel |
| 5,919,646 A | | 7/1999 | Okun et al. |
| 5,942,443 A | | 8/1999 | Parce et al. |
| 6,007,690 A | * | 12/1999 | Nelson et al. ............ 204/601 |
| 6,033,546 A | | 3/2000 | Ramsey |

FOREIGN PATENT DOCUMENTS

| | | |
|---|---|---|
| WO | 93/22054 | 11/1993 |
| WO | 93/22055 | 11/1993 |
| WO | WO 93/22058 | 11/1993 |
| WO | 93/22421 | 11/1993 |
| WO | 95/27210 | * 10/1995 |
| WO | 96/04547 | 2/1996 |
| WO | 96/14934 | 5/1996 |
| WO | WO 96/15269 | 5/1996 |
| WO | WO 96/30760 | 10/1996 |
| WO | 96/38730 | 12/1996 |
| WO | 97/00125 | 1/1997 |
| WO | 97/04297 | 2/1997 |
| WO | 97/45644 | 12/1997 |

OTHER PUBLICATIONS

Austin, RH, et al., "Electrophoresis and Micro Lithography", *Analusis*, 21(5), pp. 235–238 (1993).

Cheng, J., et al., "Microchip–Based Devices for Molecular Diagnosis of Genetic Diseases", *Mol. Diagn.* 1(3), pp. 183–200 (1996).

Cheng, J., et al., "Analysis of Ligase Chain Reaction Products Amplified in a Silicon–Glass Chip Using Capillary Electrophoresis", *J. Chromatogr.*, 732(1), pp. 151–158 (1996).

Cheng, J., et al., "Chip PCR. II. Investigation of Difference PCR Amplification Systems in Microfabricated Silicon–Glass Chips", *Nucleic Acids Res.*, 24(2), pp. 380–385 (1996).

Kricka, LJ, et al., "Enhanced Chemiluminescence Determination of Alpha–Amylase by Use of Amylose Labeled with Horseradish Peroxidase", *Talanta*, 37(10), pp. 971–974 (1990).

Shoffner, M.A, Cheng, J., et al., "Chip PCR. I. Surface Passivation of Microfabricated Silicon–Glass Chips from PCR", *Nucleic Acids Res.*, 24(2), pp. 375–379 (1996).

Volkmuth, WD, et al., "Trapping of Branched DNA in Microfabricated Structures", *Proc. Nal. Acad. Sci., USA*, 92(15), pp. 6887–6891 (1995).

Volkmuth, WD, et al., "DNA Electrodiffusion in a 2D Array of Posts", *Phys. Rev. Lett.*, 72(13), pp. 2117–2020 (1994).

Volkmuth, WD, et al., "DNA Electrophoresis in Microlithographic Arrays", *Nature*, 358(6387), pp. 600–602 (1992).

Boyum, *Scand. J. Clin. Invest.*; (1968) 21, Suppl.97.

Brody et al., *Solid–State Sensor and Actuator Workshop, Hilton Head, South Carolina*; (1996) 104–108.

Brody, *The 8th International conference on Solid–State Sensors and Actuators, and Eurosensors IX, Stockholm, Sweden*; (1995) 779–782.

Carlson, *White Blood Cell Penetration and Fractionation in a Microlithographic Array, Cambridge Healthtech Institute, 2nd Annual Microfabrication Technology for Biomedical Applications*; (Oct., 1996).

Crowley, *Biophys. J.*; (1973) 13:711–724.

Dower et al., *Nucleic Acids Res.*; (1988) 16:6127–6145.

Effenhauser et al., *Anal Chem*; (1993) 65:2637–2642.

Fan et al., *D.J. Anal Chem.*; (1994) 66:177–184.

Fettinger et al., *Sensors and Actuators B.*; (1993) 17:19–25.

Fluri et al., *Analy. Chem.*; (1996) 68:4285–4290.

Hagar et al., *Cell Calcium*; (1992) 13:123–130.

Harrison et al., *Science*; (1993) 261;895–897.

Kitagawa et al., *Electrophoresis*; (1995) 16:1364–1368.

Kricka et al., *Clin. Chem.*; (1993) 39/9:1944–1947.

Kricka et al., *Pure and Applied Chemistry*; (1996) 68:1831–1836.

Rech et al., *Nucleic Acids Res*; (1990) 18:1313.

Ruzicka, *Analyst*; (1994) 119:1925–1934.

Ruzicka, *Analyst*; (1996) 121:945–950.

Seiler et al., *Anal Chem*; (1993) 65:1481–1488.

Serpersu et al., *Biochim, Biophys, Acta*; (1985) 812:779–785.

Slappendel et al., *J.J. Blood*; (1994) 84:904–909.

Tracey, *IEEE Transactions on Biomedical Engineering*; (1995) 42/8:751–761.

Washizu, *Integrated Micro–Motion systems—Micromachining, Control and Applications* (1990) 417–431.

Wilding et al., *Chin. Chem.*; (1994) 40/1:43–47; and.

Zimmerman et al., *Biophys. J.*; (1974) 14:881–899.

D. Jed Harrison, "Capillary Electrophoresis and Sample Injection Systems Integrated on a Planar Glass Chip", *Analytical Chemistry*, vol. 64, No. 17, Sep. 1, 1992, pp. 1926–1932.

Cooper, JM, et al., "Microengineered Sensor Systems for Drug Screening", *Anal. Meth. & Instr.*, Special Issue μTAS '96, p. 123.

Miura, K., et al., "Fabrication of Injection and Switching Valve for Whole Blood Control", publication unknown, pp. 85–88.

Tracey, M., et al., "A Microfluidics–Based Microcytometer: Interfacing Microfluidics with Macrofluidics", publication unknown, pp. 89–92.

* cited by examiner

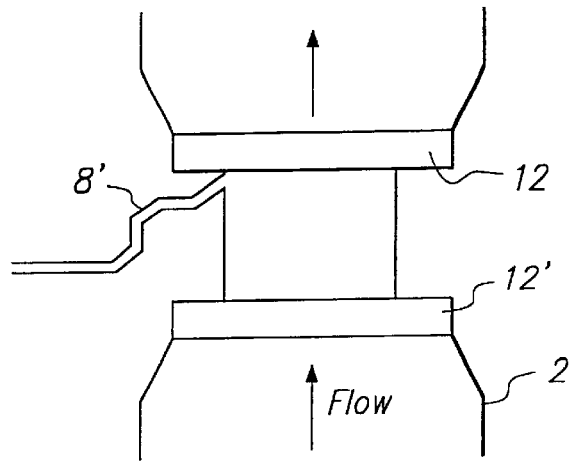
FIG. 4A
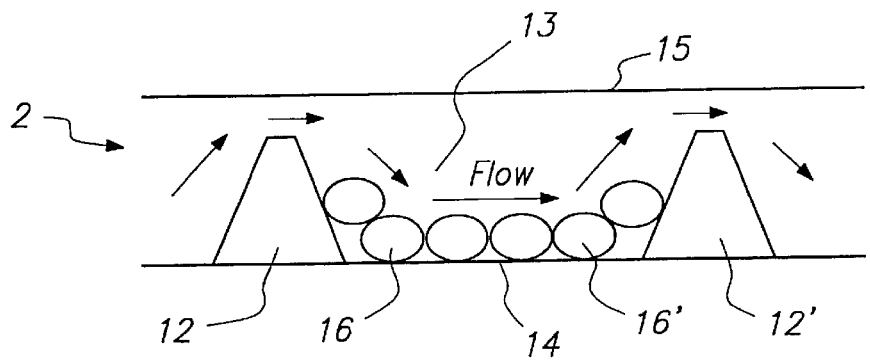
FIG. 4B
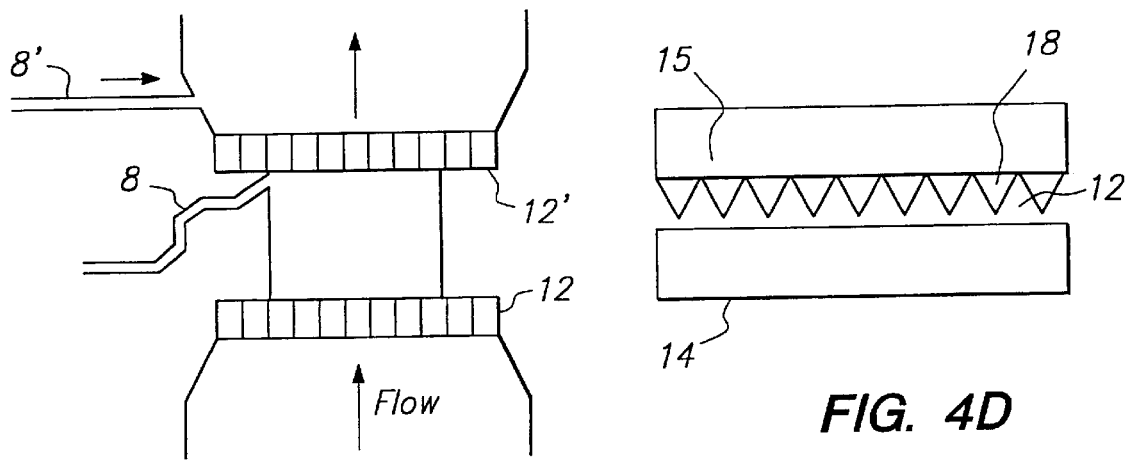
FIG. 4C
FIG. 4D

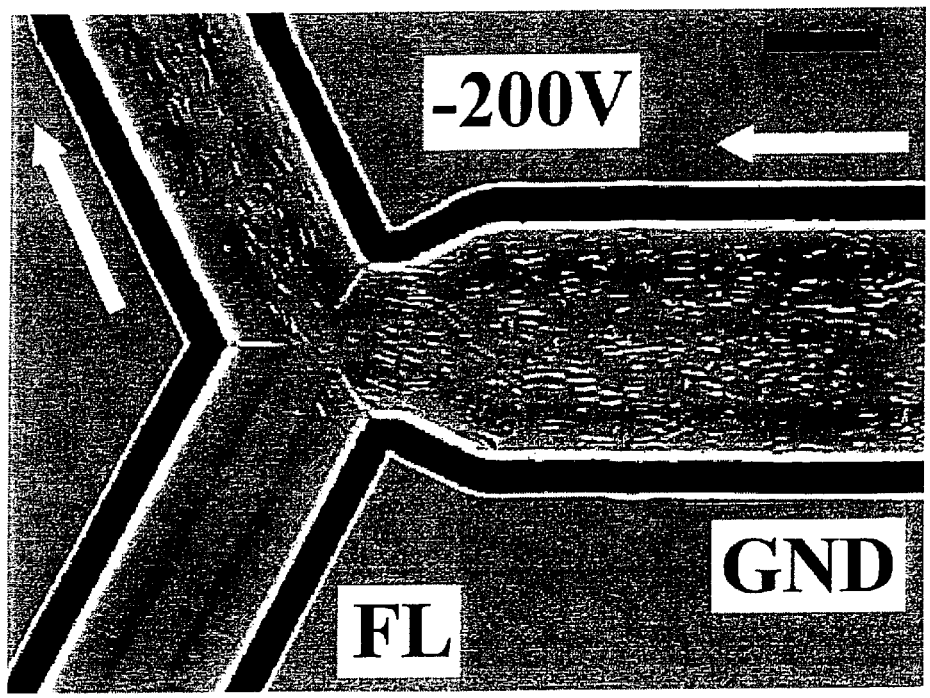
FIG. 6C
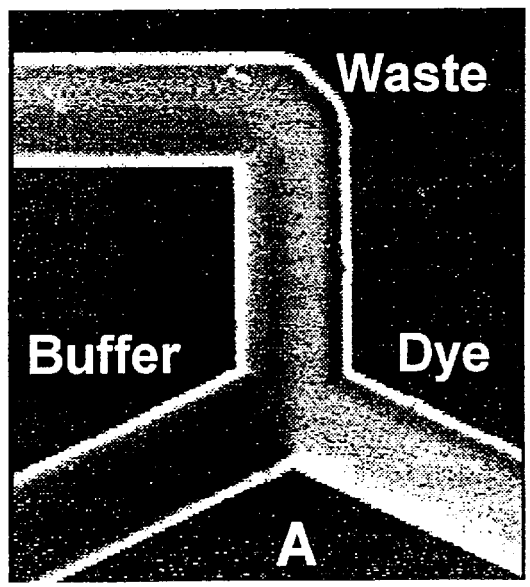 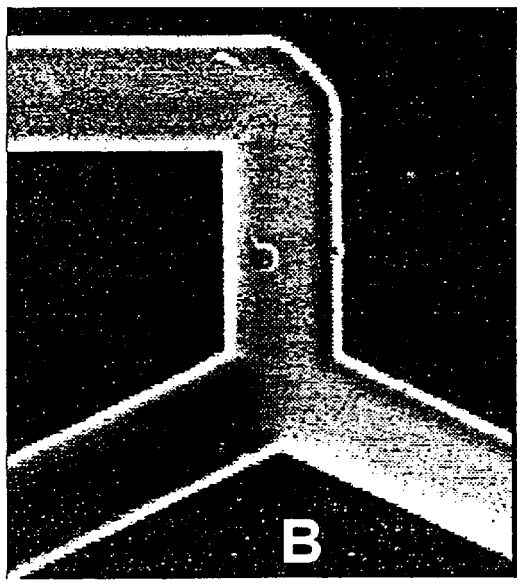
FIG. 7A    FIG. 7B

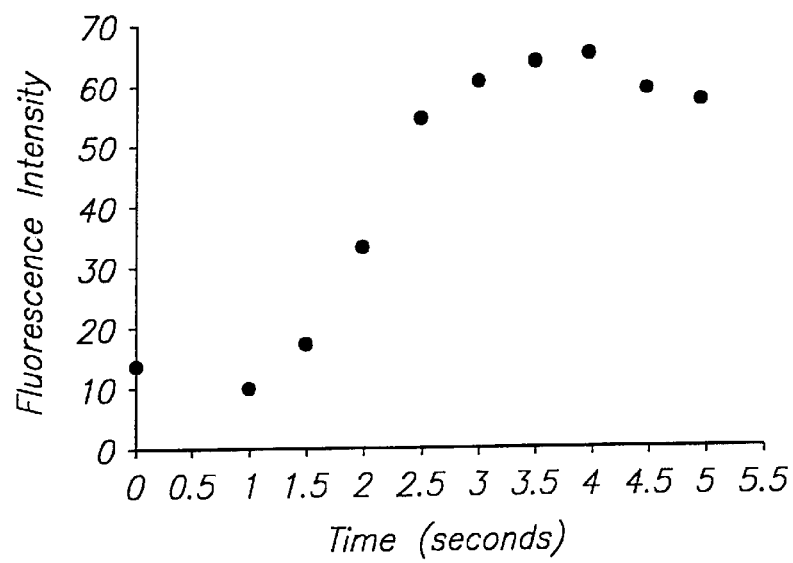
FIG. 11
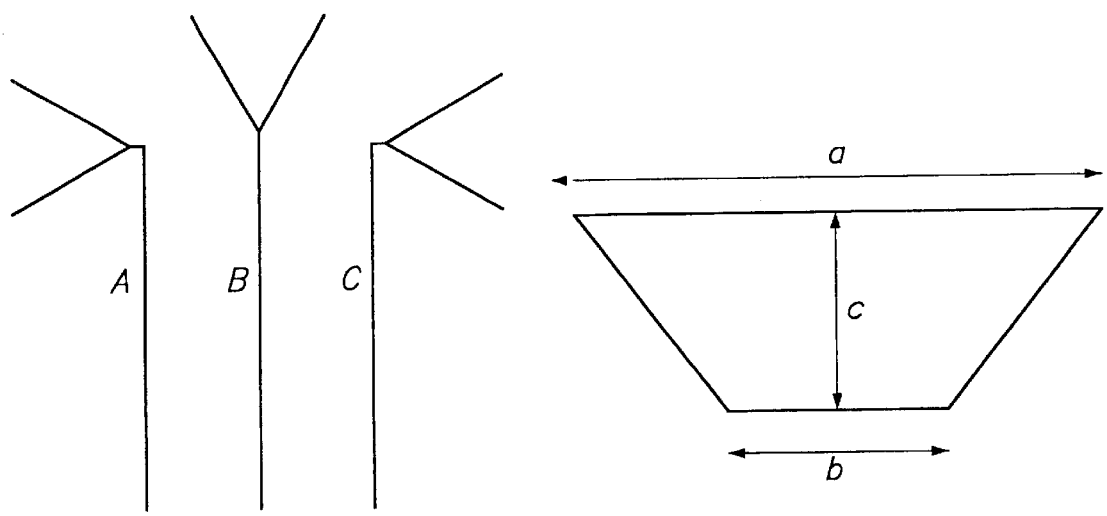
FIG. 12  FIG. 13

MICROFLUIDIC SYSTEM AND METHODS OF USE

CROSS-REFERENCE TO RELATED APPLICATIONS

This application claims the benefit of U.S. Provisional Application No. 60/047,024 filed on May 19, 1997, and this application is a continuation-in-part of U.S. application Ser. No. 08/858,087 filed on May 16, 1997, both of which are incorporated by reference herein in their entirety.

FIELD OF THE INVENTION

This invention relates to a novel microfluidic device and methods of using this device to conduct in vitro studies on the reaction and effects of various compounds on cells.

REFERENCES

The following references are cited in the application.
1. Harrison et al., *Science;* (1993) 261:895–897.
2. Fluri et al., *Analy. Chem.;* (1996) 68:4285–4290
3. Kitagawa et al., *Electrophoresis;* (1995) 16:1364–1368
4. Kricka et al., *Pure and Applied Chemistry;* (1996) 68:1831–1836
5. Fettinger et al. Sens Actuat B. 17 (1993) 19
6. Zimmerman et al., *The electromanipulation of cells,* CRC Press (1996)
7. Fan et al., D. J. *Anal Chem.;* (1994) 66:177–184
8. Slappendel et al., *J. J. Blood;* (1994) 84:904–909
9. Agar et al., *Red Blood Cells of Domestic Mammals;* Elsevier; Amsterdam (1983)
10. Greenwalt et al., *The human red cell in vivo;* Grune & Stratton; New York (1973)
11. Harrison et al. *Science;* (1993) 261:895–897
12. Effenhauser et al., *Anal Chem;* (1993) 65:2637–2642
13. Seiler et al., *Anal Chem;* (1993) 65:1481–1488
14. Lehninger, A. L. *Biochemistry;* 2nd ed.; Worth Publishers: New York (1975)
15. Berry, D. R. *The Biology of Yeast;* E: Arnold: London (1982)
16. Rech et al., *Nucleic Acids Res;* (1990) 18:1313
17. Crowley, J. M. *Biophys. J.;* (1973) 13:711–724
18. Zimmermann et al., *Biophys. J.;* (1974) 14:881–889
19. Serpersu et al., *Biochim, Biophys, Acta;* (1985) 812, 779
20. Dower et al., *Nucleic Acids Res.;* (1988) 16:6127–6145
21. Hagar et al., *Cell Calcium;* (1992) 13:123
22. Boyum, A., "Separation of leucocytes from blood and bone marrow", *Scand. J. Clin. Invest.* (1968) 21, Suppl.97

BACKGROUND

The in vitro manipulation, study and processing of individual cells continues to be of importance both for theoretical evaluation as well as for the in vitro assaying of compounds for biological activity in such cells. However, conventional biological assay systems such as flow cytometry and cell perfusion chambers are typically operated with from 1 ml to 100 ml of reagents or more. A further disadvantage of techniques involving large volumes of cells is the inability to observe the effects on a cell before, during and after it comes into contact with a candidate compound. Finally, statistical variations within a population of cells can limit the ability to resolve the effect of a compound.

Recently small disposable devices have been developed for handling biological samples and for conducting in vitro experiments on a controlled basis. For example, microchips have been used to electrophoretically separate mixtures of amino acids (1). Fluri et al. (2) also describe an integrated capillary electrophoresis device where electrophoresis is used to separate mixtures of amino acids.

The manipulation of a single cell by its electrophoretic mobility has been shown in a capillary (3). Microchips have been designed to evaluate sperm function, principally motility, for in vitro fertilization (4).

Analysis of the effects of candidate compounds on cell function demands careful handling of candidate compounds which are often limited in both quantity and concentration. The ability to observe the effect of the candidate compounds on individual cells in a device potentially suitable for a high level of multiplexing makes miniaturized analysis very attractive. Furthermore, the ability to observe the effect of a candidate compound on non-adherent cells would be beneficial.

Microfluidic systems embodied in a microchip would use small volumes, providing cost saving advantages for work involving expensive reagents, especially candidate compounds made for new drug screening and of course would reduce the amount of candidate compound required.

The ability to sort cell responses into classes and analyze each class separately would reduce the apparent statistical variation seen when large number of cells are evaluated en masse. Single cell studies would also allow the progression of events within a single cell to be evaluated, in contrast to flow cytometry where a progression of events is studied over an ensemble of cells. Statistical variations within an ensemble can limit the ability to resolve a particular effect, whereas working with individual cells will maximize resolution and signal to noise for a given event.

It would be therefore advantageous to manipulate and transport cells within a microfabricated reaction device thereby allowing the observation of the cell reactions.

SUMMARY OF THE INVENTION

The present invention is directed, in part, to a method of observing the effect of a compound or a mixture of compounds on cells in a microfluidic device having a main flow path having a detection zone, at least two inlet flow paths intersecting and merging with the main flow path at or upstream of the detection zone. One method comprises applying at least one cell to a first inlet flow path and the desired compound to a second inlet flow path; inducing flow of the cells and the desired compound toward the outlet; allowing the cells to mix with the desired compound at the intersection of the second inlet flow path and the main flow path; and observing the effect of the compound on the cells in the detection zone.

In one of its method aspects the present invention is directed to a method for studying calcium influx on a cell in a microfluidic system having a main flow path having a detection zone and an outlet, at least two inlet flow paths sequentially intersecting and merging with the main flow path upstream of the detection zone which method comprises applying lymphocytes to a first inlet flow path and an activator to a second inlet flow path; inducing flow of the lymphocytes and the activator toward the outlet; allowing the lymphocytes to interact with the activator at the intersection of the second inlet and the main flow path; and observing the effect of the activator on the lymphocytes in the detection zone. This method preferably is further elaborated wherein the device further comprises a third inlet flow path which intersects with the main flow path upstream of the detection zone and an inhibitor is added to the third inlet flow path and the effect of the inhibitor is observed in the detection zone.

In another of its method aspects the present invention is directed to a method for studying leukocyte rolling comprising a microfluidic system having a main flow path with a detection zone and an outlet, at least two inlet flow paths intersecting into the main flow path upstream of the detection zone and wherein the walls of the main flow path in the detection zone have attached thereto a cell adhesion molecule; applying at least one leukocyte cell to a first inlet flow path; applying at least one leukocyte cell and a candidate compound to a second inlet flow path; inducing flow of the cells and the candidate compound into the main flow path and toward the outlet; allowing the leukocytes; candidate compound and the cell adhesion molecules to interact; and observing the leukocyte rolling in the detection zone. The method is preferably further elaborated wherein the device further comprises at least two detection zones wherein the walls of the main flow path in the first detection zone are free of adhesion molecules and the walls of the main flow path in the second detection zone have adhesion molecules attached thereto; and observing the rolling of the leukocytes in both detection zones.

In one of its product aspects the present invention is directed to a microfluidic device comprising a main flow path comprising a detection zone and an outlet; at least two inlet flow paths intersecting in fluid communication with the main flow path at or upstream of the detection zone at an upstream angle of less than 90°.

In another of its product aspects the present invention is directed to an observation device comprising a plurality of the microfluidic devices of the present invention wherein the main flow paths of the microfluidic devices are substantially parallel at their detection zones.

BRIEF DESCRIPTION OF THE DRAWINGS

FIG. 4A is a diagrammatic representation of a main flow path in a microfluidic device of the invention having weir-type trap as a flow restriction device to capture cells.

FIG. 4B is a schematic, not to scale, longitudinal cross-sectional view of the main flow path shown in FIG. 4A, taken along the flow path, illustrating the effect of a weir-type trap used to capture cells.

FIG. 4C is a diagrammatic representation of a main flow path in a microfluidic device of the invention having a weir-type trap used as a flow restriction device to capture cells. The weir-type trap defines channels which further impede the flow of cells.

FIG. 4D is an elevation of a flow restriction device as used in FIG. 4C.

FIG. 6C is a picture of *E. coli* at an intersection of the microfluidic device.

FIGS. 7A and 7B are CCD images of the mixing of the Bengal Rose dye at an intersection in the microfluidic device. FIG. 7A depicts the flow of the fluid; FIG. 7B depicts the mixing of fluid when the flow is stopped.

FIG. 11 is a graph of a kinetic plot of the calcium flux in a human lymphocyte.

FIG. 12 is a schematic of the design of "Y" configured microfluidic devices.

FIG. 13 depicts an approximate cross section of a channel of the microfluidic device.

DETAILED DESCRIPTION OF THE INVENTION

Figure 1:
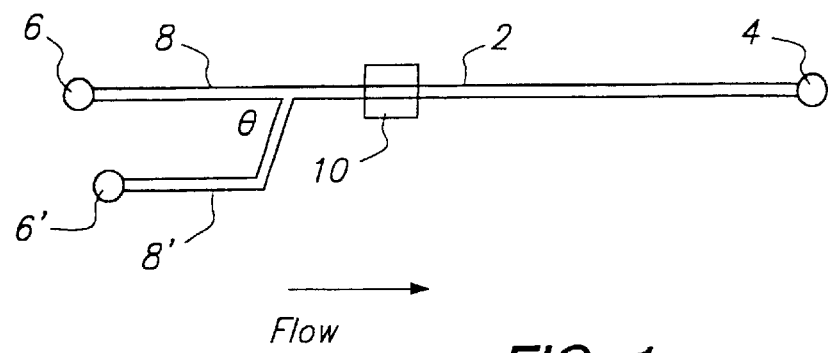
FIG. 1A is a diagrammatic representation of a microfluidic device of the invention.
FIG. 1B is a perspective view of a microfluidic device of the invention.

The present invention provides a microfabricated device for the evaluation of the effect of one or more compounds or a mixture of compounds on individual cells. The invention further provides systems which include the microfabricated device of the invention together with a detection device, e.g. an microscopic device.

Definitions

However, prior to discussing this invention in further detail, the following terms will first be defined.

The term "flow paths" means the capillary paths or channels that are present in the microfluidic device.

The term "flow inducing means" encompasses devices which have the ability to induce flow. Flow may be induced by negative pressure, positive pressure, electrophoretically or osmotically. This may be accomplished by peristaltic or reciprocating pumps, syringes, electricity, or piezo elements. In a preferred embodiment, the flow inducing means includes the ability to reverse the flow direction. For example, a device capable of exerting both positive and negative pressure can induce flow by positive pressure and can reverse flow by negative pressure.

The term "stop flow" means stopping or temporarily halting the fluid flow through the microfluidic device so as to allow the mixing of the contents of two or more flow paths and so that observation of the reaction of the candidate compound on the cell is possible.

The term "candidate compound" or "proto-drug" or "desired compound" means drug candidates, proto-drugs, cell inhibitors, cell activators, cell adhesion molecules including selecting, lectins, integrins, and cell receptors, and any other compound or reagent of interest in determining its affect upon a cell.

The term "cell" includes both eukaryotic and prokaryotic cells, including bacteria, yeast, mammalian cells etc. Preferably the cells are eukaryotic cells and more preferably they are leukocytes. Other cells include gangliocytes, fibroblasts or any cell which can be suspended in a single cell suspension. Preferably the cells are viable.

The term "cell adhesion molecule" means any molecule which facilitates cell adhesion. These include selecting, lectins, integrins and any other cell surface molecule which will facilitate adhesion of leukocytes to the walls of the device.

The term "activator" means a candidate compound believed to induce a cell to respond. In a preferred embodiment the activator is the calcium ionophore, A23187 (calcimycin).

The term "inhibitor" means a candidate compound believed to inhibit a cell from responding to an activator compound or to a cell adhesion molecule.

The term "calcium influx" describes the process of induction of intracellular $Ca^{2+}$ flux within leukocytes, which is an indicator of cell activation. Activated leukocytes are directly involved in normal and abnormal immune response. A rapid increase in the intracellular messenger, $Ca^{2+}$, is the second signal in the activation pathway of all mammalian cells. Thus, a rise in cytosolic free $Ca^{2+}$ is the key signaling event for activation.

The term "leukocyte rolling" means the process of a leukocyte rolling on an endothelium as the first event leading to cell migration through tissue. The basic molecular mechanisms of the inflammatory response comprise a cascade of events brought about by the sequential binding of different adhesion receptors. The first step in the adhesion cascade is the reversible binding mediated by selectins which cause the leukocytes to roll along the inflamed endothelium. The second step is leukocyte activation mediated by cytokines that induce leukocytes to flatten on the endothelium resulting in transmigration into the tissue. Cells which are activated and adhere to a surface appear to travel in a rolling fashion in a flowing stream, exhibiting a lower average velocity than nonadhering cells.

With reference to FIGS. 1A and 1B, the microfluidic device of the present invention comprises a main flow path 2 having an outlet 4 and a detection zone 10 positioned so as to allow detection of any cellular reaction and at least two inlet flow paths 8 and 8', in fluid intersection with the main flow path 2 upstream of the detection zone 10 and the outlet. The inlet flow paths have inlet ports 6.

The microfluidic device is obtained from a solid substrate, preferably in the form of a chip. The dimensions of the device, e.g., chip, are not critical but preferably these dimensions are in the order of about 0.001 centimeters to about 10 centimeters thick and approximately about 0.3 centimeters to about 30 centimeters on a side.

The device of the invention may be conveniently constructed by forming the flow passages in the surface of a suitable substrate or base plate and then mounting a cover over such surface. It is also contemplated that the invention may be constructed by forming the flow passages in the surface of the base and the cover and then aligning the passages when mounting the cover onto the base.

The base and the cover may comprise a material such a silicon, polysilicon, silica glass, thermocouple materials, gallium arsenide, polyamide, silicon nitride and silicon dioxide. The cover and/or base may also comprise a plastic material, such as acrylic, polycarbonate, polystyrene, polyethylene, polydimethyl siloxane or other resin materials. Preferentially the cover and base may comprises a material that permits detection of a signal, more preferably it is a material transparent to ultraviolet, infra red or visible light or permits radioactive detection. In a particularly preferred embodiment it may be a relatively thin, fusion or anodically bonded layer of glass or ultrasonically welded plastic sheet material.

The flow paths 2, 8 and 8' have dimensions of from about 0.1 $\mu$m deep by 0.1 $\mu$m wide to about 1 mm deep by 2 mm wide. Preferably, the flow paths are from about 5 $\mu$m deep by 500 $\mu$m wide to about 30 $\mu$m deep by 200 $\mu$m wide. The width of the flow paths in the device is sufficiently small to enable observation of the effect of a candidate compound on a single cell. Preferably, the length of the flow paths will be within the range of from about 50 $\mu$m to about 2 meters, preferably they are from about 1 millimeter to about 100 centimeters in length.

The flow passages and other structures, when viewed in cross-section, may be triangular, ellipsoidal, square, rectangular, circular or any other shape at least one cross-sectional dimension of which, transverse to the path of flow of sample fluid through or into a given structure, is from at about 0.1 $\mu$m to about 2 mm, preferable from about 5 $\mu$m to about 500 $\mu$m.

In a preferred embodiment one or more inlet flow paths are of greater diameter than the main flow path. This difference in diameter between the inlet flow paths and the main flow assists in the regulation of the flow rates. For example, when the flow inducing means is electricity, the difference in flow path widths may compensate for the drop in electrical potential in the main path and may achieve a better potential gradient along the main flow path.

The inlet paths intersect with the main flow path. With reference to FIG. 1A, the upstream angle of intersection of each of the inlet flow paths with the main flow path is preferably at an angle less than 90°, more preferably at an angle of less than about 70° and most preferably at an angle of less than 50°. It has been found that where the inlet flow path with the main flow path intersects at an upstream angle of 90° or greater the turbulence generated at the intersection of the inlet flow path with the main flow path may result in damage or rupture of the cells. Such damage or rupture is to be avoided if an accurate determination of the effect of the candidate compound is to be determined. In addition, lysis of the cells may cause the main flow path to become clogged, preventing subsequent observations of additional cells.

It is contemplated that excess sample fluid, cells, reagents, wash solutions and the like from the main flow path outlet 4 may be routed into a waste receptacle of adequate capacity such that all sample fluid and reaction products are safely contained for disposal.

The effect of the candidate compound on the cell is monitored through the detection zone 10. Detection of the effect of the candidate compound on the cell can be detected by any number of methods including by optical detection through a transparent cover or a translucent section of the base either visually or by machine. The effect of the candidate compound can also be monitored by changes in flow properties or in electrical conductivity. Devices such as valves, pressure sensors, and other mechanical sensors can be fabricated by well established technologies. Such devices can be manufactured directly on a silicon substrate according to well established technologies.

The device also may be utilized in combination with an appliance for viewing the effect of the candidate compound on the cells. The appliance in one embodiment may comprise a microscope for viewing the effect. It is contemplated that the microscope may be an inverted microscope or a confocal microscope. A UV light source or laser beam used to activate cell fluorescence may also be used to observe the effects of candidate compounds on a cell.

In another embodiment, a camera may be included in the appliance. The camera could include a video camera. In another embodiment the data may be observed using a photomultiplier tube (PMT) affixed to the microscope instead of a camera. If a PMT is utilized, it is contemplated that a pinhole will be used in conjunction with the microscope to limit the field of view of the PMT.

It is contemplated that a scintillation device may also be used to detect the effects of a candidate compound on a cell where a radioactive dye is utilized.

In another embodiment, electrical conductors may be fabricated in the base of the device to enable transmission of signals. The electrical conductors in the device carry signals from pressure or electrical conductivity sensors enabling detection of the conductivity or pressure of the cells in the flow system.

It is contemplated that the inlet flow paths have inlet reservoirs for placing the cells and or the candidate compounds into the inlet flow paths.

The microfluidic device can be used in combination with an appliance for delivering fluids and cells to the microfluidic device via the inlet ports 6 and 6' and discharging fluid and cells from the device via the outlet 4. The appliance may include an implement such as a pump for conveying the fluids and cells through the flow paths of the microfluidic device. The pump may be incorporated into the device according to known microfabrication techniques.

Fluid control can be achieved using various pumps, such as micromachined pumps, reciprocating pumps, peristaltic pumps, diaphragm pumps, syringe pumps, volume occlusion pumps as well as endoosmotic induced flow, flow induced by electrochemical evolution of gases and other pumping means known to those skilled in the art. Fettinger et al.(5) have shown it is possible to use external pumps to control a valveless, microfluidic system. It is contemplated that some reservoir contacts to the inlet flow paths 6 and 6' would be left open to atmosphere, while others were connected to pumps operated in a combination of pressure and suction modes to allow the control of the flow at the intersections of the paths. Operating with pumps in a negative pressure mode will facilitate small proto-drug reservoir volumes, in the range of from about 10 μl to about 200 μl. It is contemplated that the accuracy and sensitivity of this fluid control method can be enhanced by designing the size of the flow channels to restrict flow where desired and minimize flow resistance where necessary. Good fluid control can be achieved without internal valves in the microchannels. Syringe pumps are preferred since the flow rate and bulk volume are desirable. Alternative pumps are microfabricated pumps, such as the HSG-IMT VAMP (Villengen, Germany) or other commercially available micropumps.

Flow of the fluid within the microfluidic device may also be controlled using electrical fields. In uncoated glass microchips, the solvent mobility due to electroosmotic flow is greater than the electrophoretic mobility of the cells, so the net flow direction of the cells is toward the cathode at near-physiological pH values. High electric fields, in the range of 1 kV/cm for yeast cells, 2–4 kV/cm for human erythrocytes and 5–10 kV/cm for yeast cells have previously been used to introduce DNA or other labeled substances into these cell types via electroporation. Fields of those magnitudes caused membrane permeation but did not result in cell lysis. Preferably the fields are less than about 600 V/cm and more preferably less than 100 V/cm.

It is contemplated that such means for inducing the flow of the candidate compound and the cells through the inlet flow paths and into the main flow path may also be used to stop the flow of such compounds and cells such that one or more cells are present in the detection zone simultaneously with or shortly after the candidate compound has interacted with the cell. Stoppage of the flow will allow observation of the complete effect of the candidate compound on the cell.

Means for regulating the temperature in the main flow channel 10 may optionally be utilized to enhance the reaction conditions. Means for sensing the temperature in the main flow passage may also be provided, if desired. The temperature sensing means may be operatively connected to a microprocessor or similar device which controls the overall function of the system so as to correlate the sensed temperature change with the interaction of the cell with the candidate compound.

Figure 2:
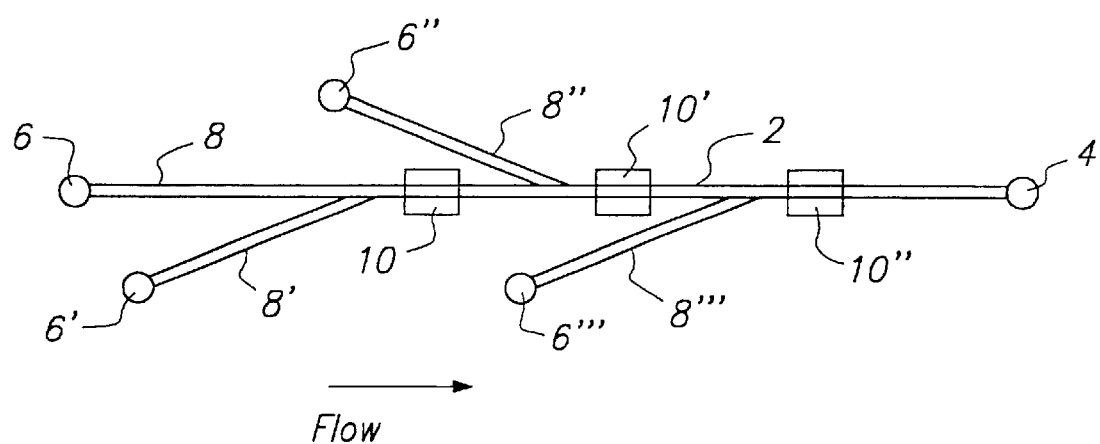
FIG. 2 is a diagrammatic representation of a microfluidic device with a plurality of inlet flow paths and detection zones.

With reference to FIG. 2, it is contemplated that the microfluidic device of the present invention may comprise a plurality of inlet flow paths 8, 8', 8" and 8'" in fluid communication with the main flow path. It is also contemplated that the microfluidic device may contain a plurality of detection zones 10, 10' and 10" each one placed adjacent to or immediately downstream of the intersection of the inlet flow path with the main flow path. Such a device would allow the observation of a number of different candidate compounds on a single cell as the cell flowed downstream in the main flow path. Alternatively, such a device would allow the simultaneous monitoring of different candidate compounds on different cells as the cells intersect with the compounds along the main flow path.

It is also contemplated that the detection zone may be located both upstream and downstream of the intersection of an inlet flow path with the main flow path. This would allow the observation of a single cell both before and after exposure to the candidate compound or alternatively the simultaneous observation of multiple cells before and after exposure to the candidate compound.

Figure 3A:
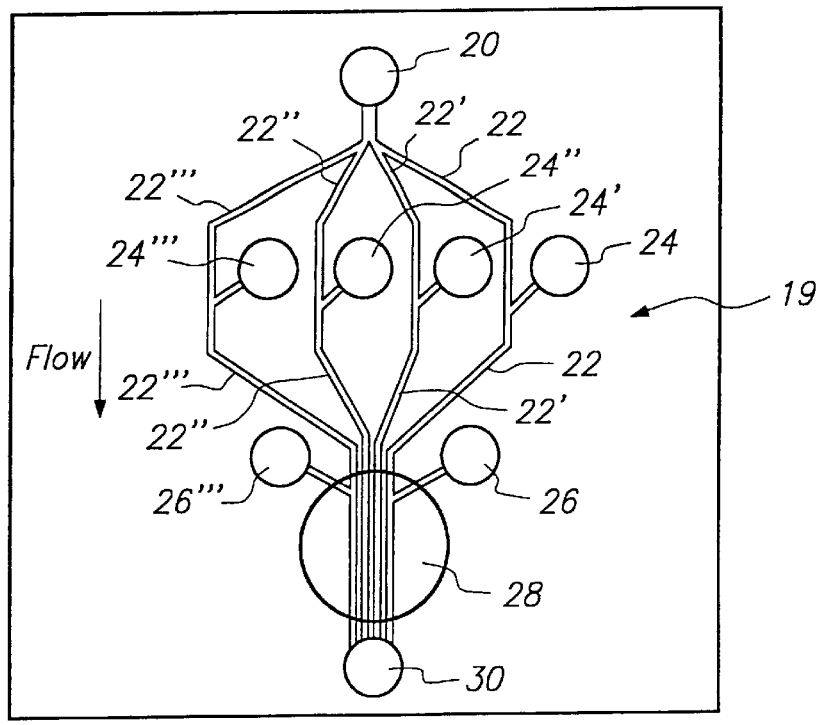
FIGS. 3A, 3B and 3C are diagrammatic representations of observation devices comprising a plurality of microfluidic devices of FIG. 1 illustrating that the main flow paths of the microfluidic devices are substantially parallel at their detection zones.
Figure 3B:
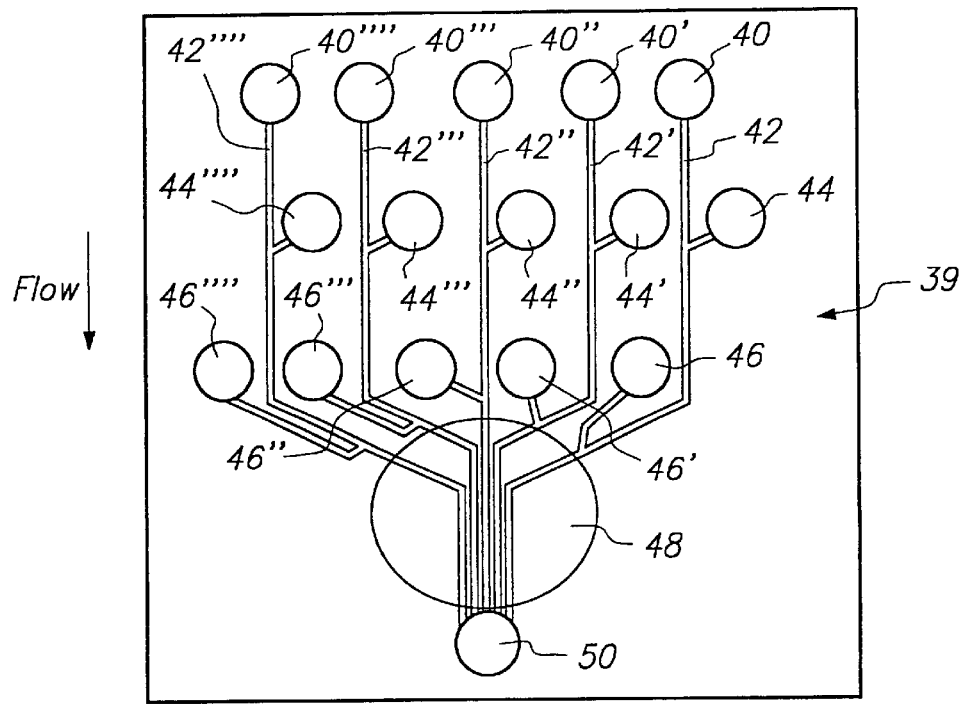
Figure 3C:
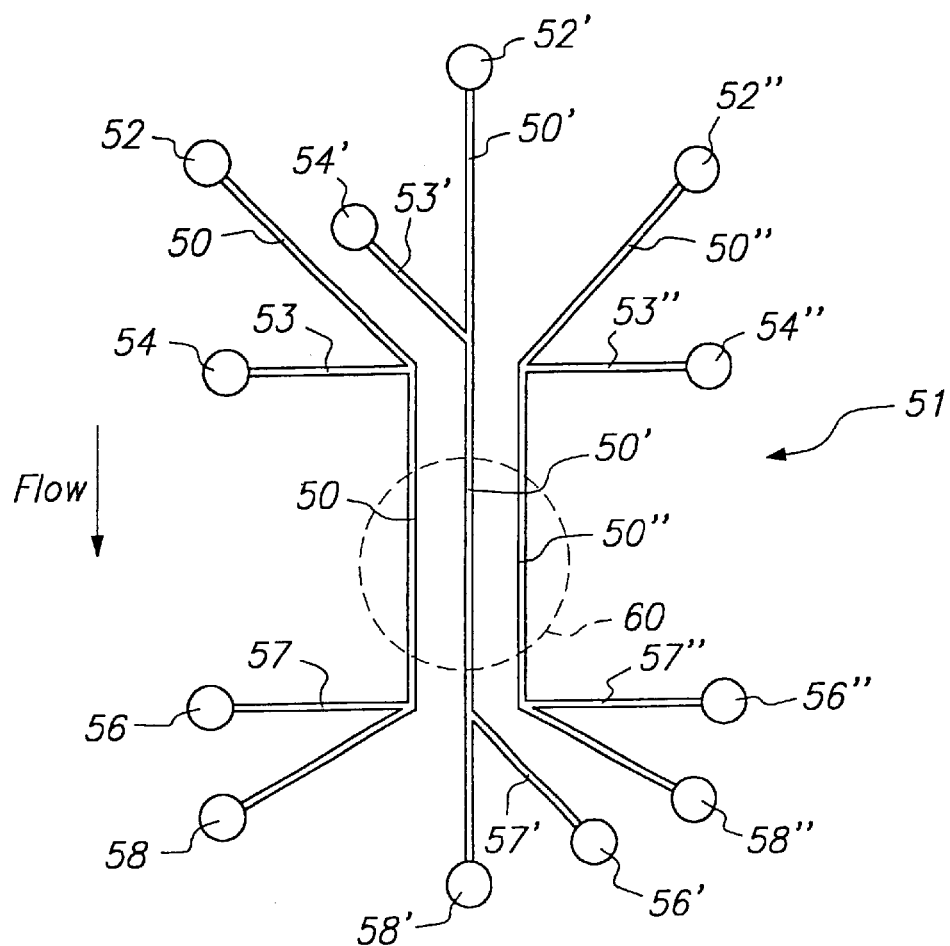

FIGS. 3A, 3B and 3C illustrate other embodiments of the present invention in which multiple microfluidic devices make up observation devices 19, 39, and 51 suitable for practicing the methods of the invention. Such devices may be used to study leukocyte rolling. In such observation devices, multiple channels are used to observe at least three relevant parameters of studying leukocyte rolling: velocity in absence of rolling, velocity on a surface that induces rolling, and velocity on the same surface with drug present. A microscope can simultaneously observe all of the channels at once.

FIG. 3A depicts a contemplated arrangement for an observation device 19 with multiple main flow paths on a single chip. This allows simultaneous testing of several candidate compounds on the same type of cell at one time. Cell chamber 20 is an inlet which is in fluid connection with microchip channels 22–22'" which define four main flow paths. Test chambers 24–24'" feed through additional inlets which intersect microchip channels 22–22'", respectively, downstream from cell chamber 20 and add a suitable candidate compound for reaction with the cells flowing from cell chamber 20. Flows from activator chambers 26 and 26'" intersect microchip channels 22 and 22'", respectively, downstream from the point of addition of the suitable candidate compounds from test chambers 24 and 24'". Each of the microchip channels 22–22'" pass though an observation zone 28 and flow into a common waste chamber 30. The flow paths may be arranged so that the observation zone (microscope view) 28 allows simultaneous observation of the four main flow paths of the microchip channels 22–22'".

As illustrated in device 39 in FIG. 3B, multiple microfluidic devices on one chip allow multiple tests at one time. These multiple tests can include a control on the same chip but in separate devices. In device 39 microchip channels 42–42''' define main flow paths from separate cell chambers 40–40''', respectively. Flows of candidate compounds from test chambers 44''44''' intersect microchip channels 42–42'''', respectively. Activator chambers 46–46'''' intersect microchip channels 42–42'''' downstream from the point of addition of the candidate compounds. Each of the microchip channels 42–42''' pass though an observation zone 48 and flow into a common waste chamber 50. As is apparent in FIG. 3B, a microscope view 48 observes the microchip channels 42–42'''' at a point downstream from the point of addition of activator.

FIG. 3C shows yet another observation device 51 providing an arrangement for multiple separate microfluidic channels on a single microchip. Microchannels 50–50'' define three main flow paths from cell chambers 52–52'', respectively. Downstream are inlet flow paths 53–53'' from candidate compound reservoirs 54–54', respectively. Still further downstream, the three main flow paths 50–50'' pass through a detector 60, such as a microscope, in which the cell rolling characteristics can be observed. Finally, the microchannels flow into outlets 58–58''.

Device 51 is provided with additional fluid paths 57–57'' which connect to fluid flow controllers 56–56'', respectively. These fluid flow devices can induce positive or negative pressure upon the flows in main flow paths 50–50''. Once the desired cells, for example leukocytes, are loaded into the cell chambers 52–52'' and candidate compounds are loaded into the reservoirs 54–54', flow may be induced by negative pressure applied by flow controllers 56–56''. The flow may be stopped and/or reversed by applying a positive pressure via the flow controllers 56–56''. Observation of the channels may be done as earlier described.

It is contemplated that different combinations of test compounds and activators or inhibitors may be simultaneously tested in each of the FIGS. 3A, 3B and 3C.

Another embodiment of the present invention, which is illustrated in FIGS. 4A and 4B, utilizes changes in flow path cross-sectional area to provide a cell capture zone. This variation can take the form of a weir-type trap. The main flow path 2 at the point of intersection with a inlet flow path 8 contains two barriers (weirs) 12 proceeding across the bottom 14 of the main flow path on either side of the inlet flow path. The barriers are not of sufficient height to reach the top 15 of the main flow channel. The barriers or weirs form a cell reservoir 13 such that cells introduced into the inlet flow path 8 tend to be captured in the cell reservoir 13. Any buffers or candidate compounds introduced into the main flow path upstream of the weirs or barriers will flow over the barriers and interact with the captured cells 16. It is contemplated that instead of using weirs or barriers to alter the flow path, the section of the main flow path immediately adjacent to the inlet flow path 8 may be deeper or the bottom 14 of the main flow path may be lower than the bottom of the inlet flow path or the main flow path on either side, effectively creating the cell reservoir 13. It is further contemplated that a cell capture force may be applied at the tops 15 of the barriers or weirs 12 or at the edge of the cell reservoir. Such cell capture force could take the form of electrical currents induced by electrodes as is done in dielectrophoresis. (6)

A variation of the cell-reservoir forming barriers (weirs) 12 is illustrated in FIGS. 4C and 4D. With reference to FIG. 4C, the weirs contain channels 18 proceeding in the direction of the flow path. Such channels 18 may be triangular in cross-section. There is a second inlet flow path 8' downstream of the downstream weir 12'. It is contemplated that a chemotactic agent may be introduced into the flow path via inlet flow path 8' immediately downstream of the weir 12'. Lymphocyte reaction to the chemotactic agent causes the lymphocyte to migrate through the channels 18 of the weir 12' toward the chemotactic agent.

Methodology

The microfluidic device described above can be used in a method for observing the effect of a compound on a cell, as will be described in further detail below.

With reference to FIGS. 1A and 1B, a solution containing the specific cells to be observed is introduced into the first inlet flow path 8 via the inlet port 6. The candidate compound is introduced into the second inlet flow path 8' via a second inlet port 6. Both of the inlet flow paths 8 and 8' are in fluid communication with the main flow path 2. Flow of the cells and the candidate compound toward the main flow path is induced. The cells are allowed to interact with the candidate compound at the intersection of the second inlet flow path 8' and the main flow path 2 and the effect of the compound on the cells is observed in the detection zone 10. It being understood that the order of the intersection of the first and second inlet paths with the main path flow 2 is not determinative. The cells may be introduced into the second inlet flow path 8' and the candidate compound introduced into the first inlet flow path 8.

After the cells and/or compounds are loaded, flow is induced within the microfluidic device. In a preferred method, the flow is controlled by a syringe or a syringe pump attached to the outlet 4 of the main flow path 2. The syringe is drawn so as to place a negative pressure on the system and induce flow. Flow may also be induced with electricity or by a piezoelectric element by methods known in the art.

The microfluidic device has at least one detection zone where the contents of the capillary flow paths may be observed.

It is contemplated that the flow of the cells and the candidate compound may be stopped when a cell or group of cells enters the intersection of the main flow path and the second inlet path so as to observe the effect of the candidate compound on the cells. The length of time that the flow is stopped or interrupted will be dependent upon the length of time for the reaction of the cell with the compound. The flow is halted to allow the cell to react sufficiently to the compound such that a possible change in the cell or the cellular function may be observed. Such a period of time is preferably from 0.1 seconds to 60 minutes, more preferably from 1 second to 10 minutes. Once the cell has reacted to the compound, if such a reaction occurs, or the cell and compound have mixed for sufficient time to allow a reaction to occur, flow of the cell and the compound is again induced to flush the cell from the detection zone and allow the observation of another cell with the candidate compound.

It is contemplated that the microfluidic device may contain a plurality of inlet flow paths as depicted in FIG. 2. In such a device cells and buffer are loaded into one inlet path, the candidate compound is loaded into a second inlet path and a second compound may be added into a third inlet path. Flow of the cells and the compounds into the main flow path and toward the outlet is induced and the effect of the compounds on the cells is observed in the detection zone. It is contemplated that the first compound may be an inhibitor and the second compound may be an activator of a cell function.

In a preferred method, the cells and inhibitor are allowed to mix within the main flow path. The flow is controlled with the syringe or syringe pump so that the cells and inhibitor mix as they travel through the main flow path. The cell/ inhibitor mixture then contacts the activator at the intersection of the third inlet. Back pressure on certain inlet flow paths may also be used in this method. A syringe is placed on the inlet path while the syringe on the outlet is drawn. The open inlet flow paths (those without a syringe attached) will flow more easily toward the outlet. This allows for a controlled mixing of inlet paths into the main flow path.

Reagents may be added to the main flow path to facilitate observation of the cell reaction to the candidate compound. Such reagents include visible dyes, fluorescent dyes and radioactive dyes. Such dyes may react directly with components produced by the cells in reaction to the candidate compound. Alternatively, such dye may be bound either covalently or non-covalently to a ligand or antibody which binds to components produced by the cells in reaction to the candidate compound. Radioactive dyes include $^{32}P$, $^{125}I$ and $^{3}H$. Fluorescent dyes include fluorescein CALCEIN-AM, FLUO-3, FURA-2, INDO-1 QUIN-2 and related compounds available from Molecular Probes. Fluorescent pH indicators include compounds such as SNAFL, SNARF and related pH indicators. Cell viability may be measured using the compound, CALCEIN-AM. DNA may be detected in dead cells with ethidium homodimer.

The walls of the flow paths may also be coated prior to the introduction of cells and/or compounds into the device. Compounds which are useful include fetal calf serum, bovine serum albumin, protein not related to the compounds being studied, gelatin or ovalbumin. In a preferred embodiment the coating on the walls of the flow paths is electrostatically neutral to reduce the electrostatic charge of the walls of the flow paths. Preferably, fetal calf serum is used to coat the flow paths. A polymer coating such as polysiloxane or polyacrylamide or polymethylmethacrylate may also be used to coat the flow paths prior to using the device.

The device of the present invention may be utilized to examine the induction of intracellular $Ca^{2+}$ flux within leukocytes, which is an indication of cell activation. Activated leukocytes are directly involved in normal and abnormal immune responses. A rapid increase in the intracellular messenger $Ca^{2+}$ is the second signal in the activation pathway of all cells. Similarly with neutrophils a tenfold increase in the concentration of cytosolic free $Ca^{2+}$ is the key signaling event of activation. The methods of this invention contemplate evaluating the influence of agonists or antagonists on cell function by this method.

Drugs which prevent $Ca^{2+}$ activation can be of considerable importance in treating abnormal immune responses. Screening of drug candidates, or protodrugs, by evaluating their effect on $Ca^{2+}$ channel activation of non-adherent lymphocytes is useful. The ability to determine the kinetics of proto-drug binding and release by cells, while not replacing conventional pharmacokinetic studies, would provide additional, highly informative data in the early stages of screening.

In an assay to measure $Ca^{2+}$ influx, the cells and buffer are mixed with a calcium indicator such as Fluo-3 and applied to the first inlet path, the activator is applied to the second inlet path and flow of the cells and the activator is induced. The flow is stopped when one or more cells mix with the activator at the intersection of the main flow path and the second inlet flow path. Any $Ca^{2+}$ influx is measured in the detection zone.

The device of the present invention may also be used to evaluate proto-inhibitors on the calcium influx. It is contemplated that the proto-inhibitor may be mixed with the cells, buffer and calcium indicator prior to applying the cells to the first inlet flow path. The activator is applied to the second inlet path and flow of the cells and the activator is induced. The flow is stopped when one or more cells mix with the activator at the intersection of the main flow path and the second inlet flow path. Any $Ca^{2+}$ influx is measured in the detection zone. It is also contemplated that a device containing three inlet flow paths may be used. The cells and buffer are mixed with a calcium indicator such as Fluo-3 and applied to the first inlet path, the proto-inhibitor is added to the second inlet flow path, flow is induced and the inhibitor and the cells are allowed to mix. The flow may be stopped to allow sufficient time for the cells to react with the inhibitor. The activator is applied to the third inlet path and flow of the cells and the activator is induced. The flow is stopped when one or more cells mix with the activator at the intersection of the main flow path and the second inlet flow path. Any $Ca^{2+}$ influx is measured in the detection zone.

The method may also be used to study oxidative bursts of cells. The enzyme NADPH oxidase, present in stimulated granulocytes, is involved in the multicomponent enzyme pathway that results in the production of superoxide anion $O_2^-$. The oxidative burst is an important bactericidal property of these leukocytes. However, under pathologic conditions, this oxidative burst may contribute to tissue injury. The enzyme pathway can be activated by a number of antagonists including whole bacteria, phorbol esters, fMLP (formyl methionine-leucine-phenylalanine) chemotactic peptide and a variety of cytokines. The production of $O_2^-$ can be measured using the oxidant-sensitive fluorescent dye dihydrorhodamine 123 in the manner similar to that described above for measurement of $Ca^{2+}$ influx.

The methods of this invention may also be used to study leukocyte rolling on an adhesion matrix. The rolling of leukocytes on an endothelium is recognized as the first event leading to cell migration through tissue, a key event in autoimmune diseases such as arthritis. Inhibition of the primary event of cell rolling, i.e. selectin-ligand interaction, should block a number of biologically important events.

In the methods of the present invention, a purified cell adhesion molecule is introduced into the main flow path and flow of the cell adhesion molecule down the main flow path, through the detection zone, is induced to allow the cell adhesion molecules to adhere to the walls of the main flow path in the detection zone. The leukocytes are introduced into the first inlet flow path and induced to flow into the main flow path. Any rolling of the leukocytes upon exposure to the adsorbed cell adhesion molecules is observed in the detection zone. It is contemplated that an inhibitor or activator of rolling could be mixed with leukocytes and the mixture introduced into the device of the present invention through a second inlet flow path and the effect of this inhibitor or activator on the rolling of the leukocytes observed in the detection zone. It has been found that when the main flow path of the device has a cross section of from 30 $\mu$m to about 500 $\mu$m, more preferably from 50 $\mu$m to about 300 $\mu$m, the cells from the first and second inlet flow paths does not immediately mix and the effects of inhibitor or activator on the rolling ability of one population of cells can be observed next to control cells within the main flow path. Alternatively, this method can be conducted using the device illustrated in FIG. 3 to allow observation of different cell adhesion molecules, inhibitors and activators on various cells simultaneously.

It is further contemplated that the device may have a third inlet flow path located between the first and second inlet flow paths leading to the main flow channel. Buffer could be introduced into the third inlet flow path to separate the cells coming from the first inlet flow path from the cells coming from the second inlet flow path within the main flow channel. The cross-section dimensions of the third inlet flow path are preferably from about 5 µm–500 µm and more preferably from about 30 µm–60 µm.

The present invention provides several advantages over the currently available methods to study the effects of compounds on cells. Currently, bioassays for calcium flux are performed on microtiter plates or with cuvette mixing. Bioassays for leukocyte rolling are performed in animals or in large rolling chambers. This invention allows real time viewing of the effect of a compound of interest on a living cell. The size of the microfluidic device leads to an increased number of compounds that can be physically studied. The methods of the present invention decrease the amount of sample compound needed and allows easy manipulation of individual or small clumps of cells.

In order to further illustrate the present invention and advantages thereof, the following specific examples are given, it being understood that the same are intended only as illustrative and in nowise limitative.

EXAMPLES

Example I

Preparation of the Microchip Device

Figure 5A:
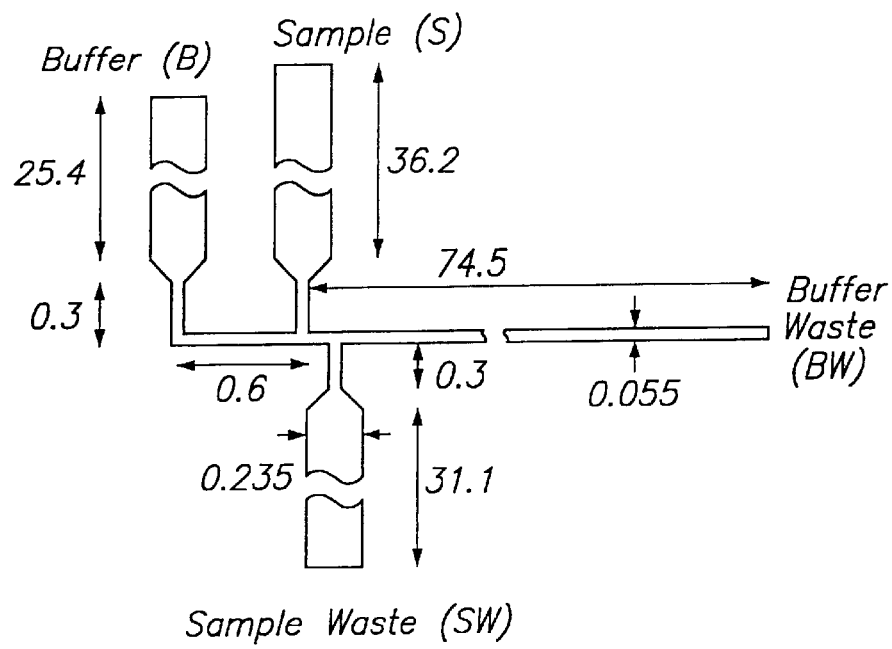
FIGS. 5A and 5B depict designs of the microchip COPI (FIG. 5A) and PCRD2 (FIG. 5B).
Figure 5B:
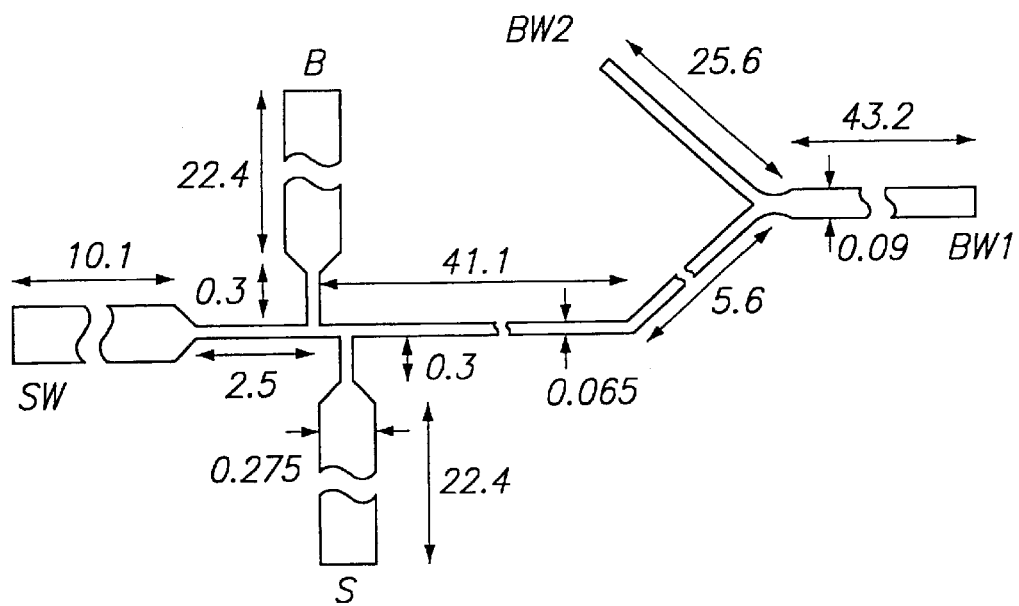

Glass devices (3 in.×3 in.) were fabricated at the Alberta Microelectronic Centre, using a modified silicon micromachining technique. (7) The substrate was a 600-µm-thick 0211 glass plate (Corning Glass Works, Corning, N.Y.). Channels of either 15 or 30 µm depth were etched on one glass plate. The lengths and widths of the channels are depicted in FIGS. 5A and 5B. A cover plate, with holes drilled for external access was thermally bonded to the etched plate using the following temperature program: 0.5 h at 440° C., 0.5 h at 473° C., 6 h at 605° C., 0.5 h at 473° C., followed by cooling overnight. Small plastic pipet tubes, glued around the drilled holes using epoxy resin, were used as device reservoirs to contain sample or buffer solutions. Pt wires were inserted for electrical contact. Some chips were coated internally using AQUASIL (Pierce, Rockford, Ill.). A 1% aqueous solution was forced into the channels by syringe, removed under vacuum, and then allowed to cure overnight.

Prior to bonding the plates together, both plates were pressure washed in a class 100 clean hood with MicroAutomation 2066 high-pressure cleaning station. The two plates were aligned before contacting. Once contacted, enough pressure was applied to drive out all the trapped air. Good contact was evidenced by the absence of interference fringes. Small particles of dirt resulted in appearance of Newton's rings around the contaminant, necessitating separation and recleaning of the wafers. This cleaning method was also applied to Pyrex wafers, resulting in so few bonding defects that only one bonding cycle was required.

Example II

Electrophoretic Mobility in a Microchip

Buffer Solutions and Reagents

A phosphate buffer, 40 mM each of $NA_2HPO_4$ and $KH_2PO_4$ (BDH analytical grade) was adjusted to pH 7.4 with either NaOH or HCl and used as an isotonic buffer for canine erythrocytes. (The plasma concentrations of $Na^{31}$ and $K^-$ in canine plasma are 94 and 6 mM. respectively. (8,9) Assuming a monoanion as the counterion gives as osmolarity of 200 mM, equal to that of the buffer prepared.) A hypotonic solvent, deionized water, was used to prepare yeast or E. coli cell suspensions. Sodium dodecyl sulfate (SDS, Serva, analytical grade) was prepared at 3 mM (0.1 wt %) in deionized water. Other chemicals were reagent grade and were used without further purification.

Cell Samples

Red blood cells of a healthy dog were obtained from Heritage Medical Research Centre (Edmonton, AB, Canada). Blood samples were collected using EDTA as the anticoagulant. These were centrifuged for separation into various blood components. After removal of the plasma and buffy coat, the erythrocytes were isolated as a cell pellet. A citrate-phosphate-dextrose (CPD) solution, (9), used to store human whole blood for enhancement of the poststorage viability of red cells, (10), was adapted for handling and storing the canine cells by addition of KCl and NaCl as well. The solutions contained 2.5 mM dextrose, 1.6 mM sodium citrate, 0.28 mM citric acid, 0.15 mM $Na_2HPO_4$, 94 mM NaCl, and 6.0 mM KCl. An erythrocyte suspension of 5% hematocrit was used. The cells were washed several times with the isotonic phosphate buffer to remove the storage buffer, using a Sanyo MSE MicroCentaur centrifuge.

Baker's yeast type II (Saccharomyces cerevisiae) was obtained from Sigma (Milwaukee, Wis.). E. coli (nonpathogenic strain, BlueScript) was donated by D. Khasa of Renewable Resources, University of Alberta. Yeast cell counts were $10^8$/ml, and E. coli cell counts were $3\times10^8$/mL, unless stated otherwise.

FIGS. 5A and 5B illustrate the layout of the device designs used for this work. Both devices utilize a "double-T" structure, which allows for formation of geometrically defined plugs of solution. (1, 11, 12). Potentials were applied to the various reservoirs to direct solvent flow within the four intersecting channels.

The experiment for yeast cell transport was performed with the COPI device, illustrated in FIG. 5A. During loading of yeast cells, the sample reservoir (S) was at +100 V, while the sample waste (SW) reservoir was at ground. During injection, the buffer reservoir (B) was set at −500 V, the S and SW reservoirs were both at +450 V, and the buffer waste (BW) reservoir was at ground.

The experiment for E. coli cell transport was performed at the Y-intersection of the PCRD2 device, illustrated in FIG. 5B. The cells were introduced at the BW1 reservoir whose potential was at ground. The BW2 reservoir was at −200 V. The potentials of the other reservoirs (B, S, and SW) were floating initially. To control flow direction, −200 V was then toggled back and forth between BW2 and SW reservoirs, leaving the alternate reservoir floating.

The visual cell lysis experiment was performed in the COPI device (FIG. 5A). The B reservoir, which contained erythrocytes and the S reservoir, containing 3 mM SDS, were both at +150 V, while the SW reservoir was at ground. The potential at BW was floating.

For the cell lysis experiment using PMT detection, the PCRD2 device (FIG. 5B) was used. Cells were introduced into the S reservoir to which 400 V was applied, versus ground on the SW reservoir. A 3 mM SDS solution was introduced into the B reservoir. During cell lysis, 400 V was applied to both reservoirs S and B, while lysis was terminated by leaving reservoir B floating. The other reservoirs, BW1 and 2, were left floating at all times.

Observations were performed with an Olympus microscope (BH-2) equipped with a JVC video camera (TK-1280). The images were first recorded using a JVC S-video cassette recorder (HR-S7200U) and then captured using a Computer Eyes/1024 frame grabber board and printed with a Codonics NP1600 photographic printer. Alternatively, an adapter was made to position a photomultiplier tube (PMT) on the microscope to detect the passage of cells via the induced light scattering. A pinhole 10 µm in diameter was used to limit the PMT's field of view. The computer controlled system for application of electric voltages at the device reservoirs and for recording the PMT signal has previously been described. (7, 13).

The three cell types studied are quite varied in size and shape: baker's yeast is close to spherical, with about a 5-µm diameter; the *E. coli* strain used is tubular, with the long dimension varying from submicrometer to about 2 µm while canine erythrocytes (red blood cells) are 8 µm in diameter and 2 µm thick. (9, 14, 15) These cell types are all negatively charged, (9, 14, 15), so in an electric field they will migrate in the direction of the anode due to electrophoretic effects. However, in uncoated glass chips, the solvent mobility due to electroosmotic flow is greater than the electrophoretic mobility of the cells, so the net flow direction of the cells is toward the cathode at near-physiological pH values. High electric fields in the range of 1 kV/cm for yeast cells, (16), 2–4 kV/cm for human erythrocytes, (17, 18, 19), and 5–10 kV/cm for yeast cells, (20), have been used to introduce DNA or other labeled substances into these cell types via electroporation. Fields of those magnitudes caused membrane permeation but did not result in cell lysis. Fields of less than 600 V/cm and more typically 100 V/cm were used, so that no lysis should occur. However, the small number of cells that were directly in the double-layer region of the electrodes used to deliver the driving potential in the reservoirs did lyse.

Since electroosmotic flow follows the electric field lines, application of a potential between sample and sample waste reservoirs caused the cells to negotiate the corners of the intersections in the double-T layout and form a plug of cells along the axis of the main channel.

Figure 6A:
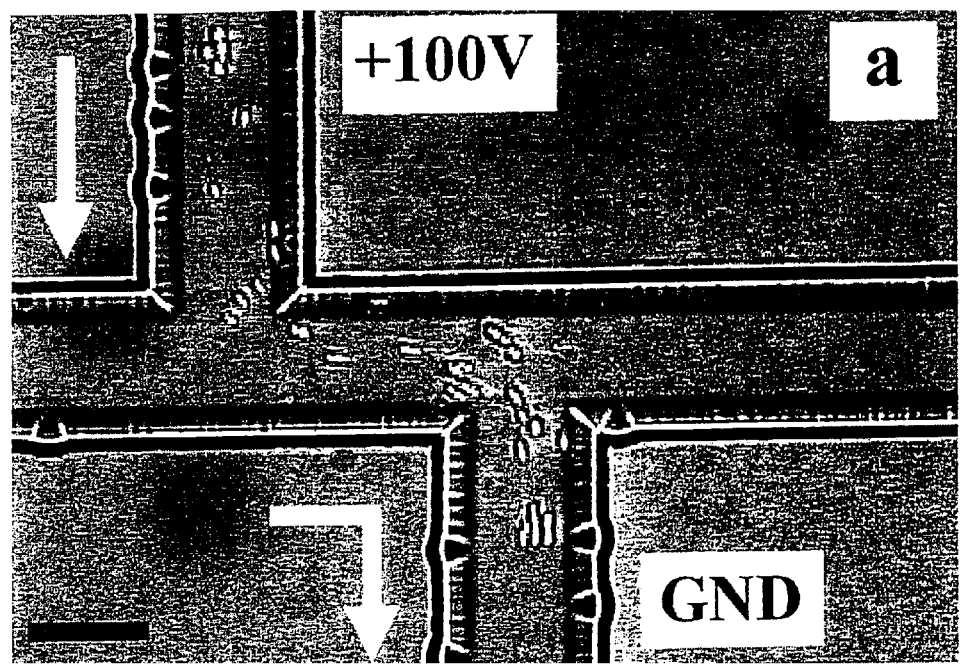
FIG. 6A is a photograph of yeast cells flowing through the microfluidic device.
Figure 6B:
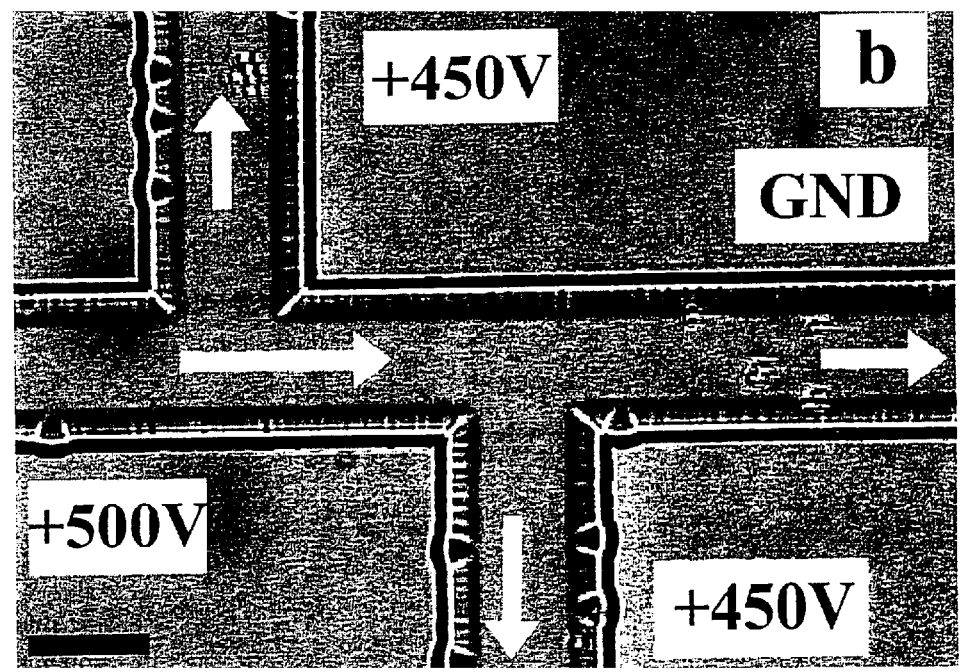
FIG. 6B is a picture of a clump of yeast cells in the microfluidic device.

FIG. 6A confirms that this valveless control scheme for directing cell transport is successful. A potential of 100 V (60 V/cm in the double-T region) produces a stream of yeast cells moving through the double-T with an average velocity of 0.18±0.02 mm/s. Once a plug of yeast cells is formed under steady state conditions at the intersection, it can be injected down the main channel by switching the potentials to the buffer and buffer waste reservoirs. FIG. 6B illustrates a packet of six cells formed in this fashion, beginning to migrate along the main channel. Potentials of 500 V at B and 450 V at both S and SW gave an electric field in the main channel of 60 V/cm and a velocity of 0.16±0.02 mm/s. With the potential at the injector intersection at about 455 V, these polarities ensured weak back flow into the sample and sample waste reservoirs during injection, to help define the cell packet. Fields at least as high as 160 V/cm can be applied to give velocities of 0.49±0.08 mm/s for the yeast cells.

FIG. 6C illustrates an example of the manipulation of *E. coli* cells at the Y-intersection of the PCRD2 device, using electric fields to control the direction of flow. These cells moved with an average velocity of 0.054±0.005 mm/s at 35 V/cm, and velocities of 0.28±0.05 mm/s were obtained at 140 V/cm. Higher voltages give higher flow rates without cell lysis but were not studied in detail, since the video rate of the camera did not allow resolution of the cells at higher velocities. The flow direction could be readily switched between the two branches of the Y by switching the negative potential between the two branches of the Y, leaving the potential of the other branch floating. The cells in the floating channel remained stationary while the potential was applied to the other branch.

Mobilization and control of flow direction were also possible with red blood cells at both the double-T and Y-intersection geometries. Erythrocyte velocities were 0.058±0.007 mm/s at 90 V/cm in an isotonic buffer solution. Experiments performed in a different buffer, containing 137 mm NaCl and 2.7 mM KCl, 4.2 mM $Na_2HPO_4$ and 1.4 mM $KH_2PO_4$, and 1.1 mM dextrose gave higher velocities, e.g., 0.55±0.09 mm/s at 140 V/cm.

Surface Coatings

Cells have a tendency to adhere to capillary walls. The yeast and *E. coli* cells in initial experiments performed with cell counts of $4×10^8$/mL and $13×10^8$/mL for yeast and *E. coli* cells, respectively, adhered to the capillary walls. Reduction in concentrations to $1×10^8$/mL and $3×10^8$/mL for yeast and *E. coli* cells, substantially eliminated the problem. It was found that devices with a 15 µm×55 µm cross section exhibited less cell sticking for yeast and erythrocytes than devices with channels about 30 µm×70 µm in cross section. However, in all devices there was some settling of the yeast and red blood cells in the solvent reservoirs contacting the channels. This meant that the cell concentration inside the chip channels was not always equal to that introduced into the reservoirs. Nevertheless, experiments could be performed for several hours before it was necessary to change the sample reservoir cell suspensions.

Treating the capillary walls with a commercial trichlorohexadecylsilane agent to make the walls hydrophobic also reduced problems with the cell adhesion. This coating substantially reduced electroosmotic flow, so that red blood cells in isotonic solution showed net migration in the direction of the anode. Nevertheless, sufficient residual charge remained on the channel walls that, in the distilled water used with the yeast or *E. coli* cells, electroosmotic flow still resulted in net migration toward the cathode.

Lysis of Canine Erythrocytes

To illustrate reaction of the cells after their transport to a certain location, a simple experiment involving the lysis of erythrocytes (or hemolysis) by a detergent was performed. This reaction occurs after mixing a stream of cells at an intersection with another stream containing a lysing agent. It was found that the anionic detergent, sodium dodecyl sulfate (SDS), lysed cells sufficiently rapidly that the lysing process could be followed in a flowing stream within the chip. While SDS will modify the electroosmotic flow rate, the direction of solvent flow will continue to be toward the cathode, so flow remained well behaved.

Two slightly different experiments were performed to study erythrocyte lysis. In one study, a photomultiplier tube ("PMT") detector was located downstream of a mixing point, near the double-T of the PCRD2 device shown in FIG. 5B. A potential of 400 V was applied between S and SW reservoirs to direct a stream of cells. A potential of 400 V was then periodically connected to reservoir B, which contained a lysing agent consisting of 3 mM SDS solution in deionized water. These potentials gave a field strength of 380 V/cm between the intersection and the detection point when only the cell reservoir was connected. A field strength of 520 V/cm was present when both cell and SDS channels were connected. The cell lysis reaction was followed by measuring the change in scattered light from the cells (using an epiluminescent microscope) at a location 2.5 mm downstream of the mixing point. The signal dropped as SDS was mixed with the flowing cell stream and then returned to its original range once the SDS flow was stopped. The signal fluctuates in the presence of the cells due to the discrete variation in the number of the cells in the detection volume as a function of time. The experiment shows the ability of electrokinetic valving action to control delivery of the lysing reagent on demand, as well as the on-chip chemical processing of cells.

Figure 10A:
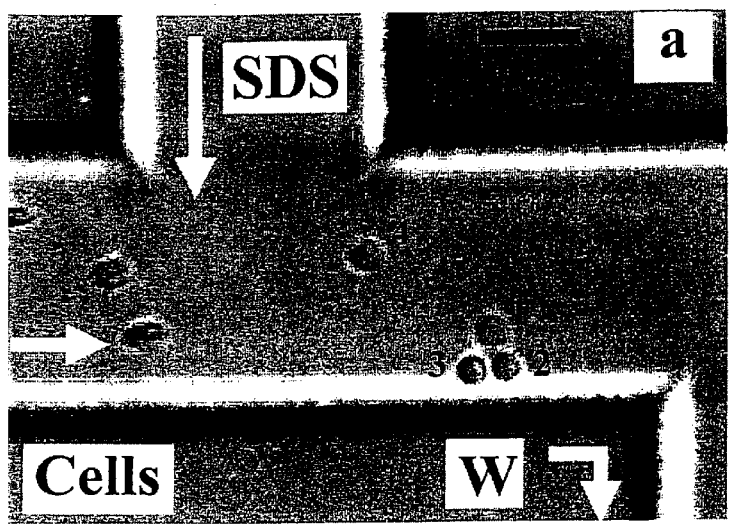
FIGS. 10A, 10B and 10C illustrate the lysis of canine erythrocytes when SDS is mixed with erythrocytes at an intersection of the microfluidic device.
Figure 10B:
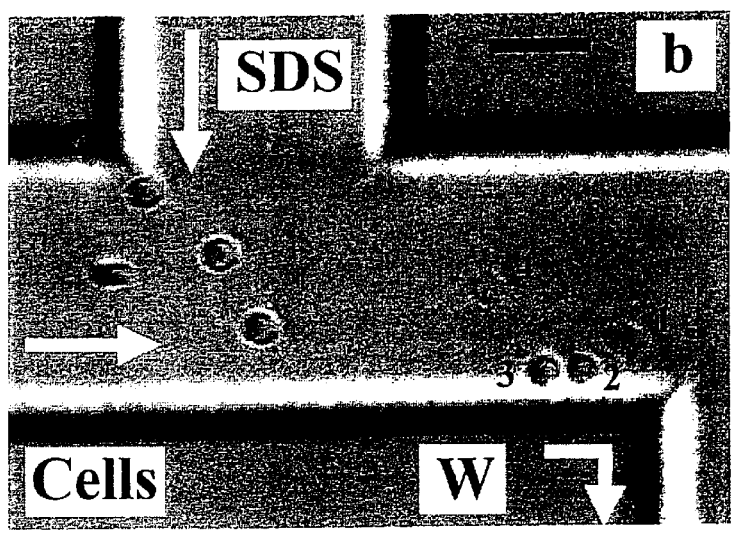
Figure 10C:
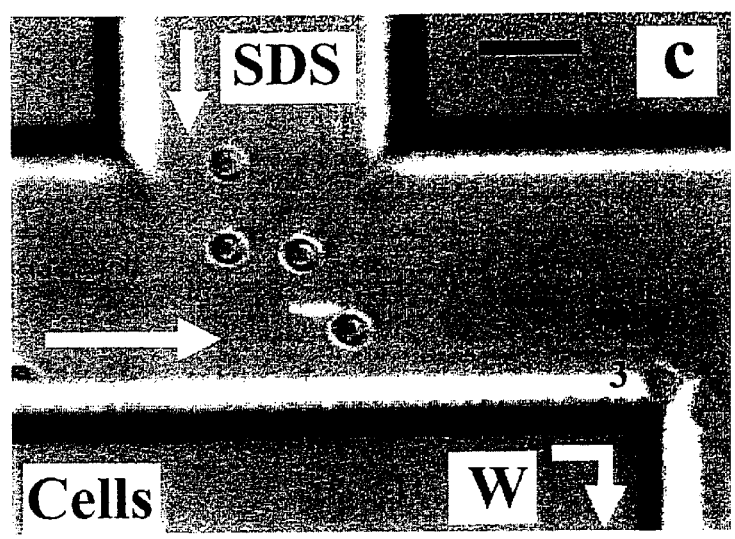

In a second experiment, cells were introduced in the buffer reservoir, with 3 mM SDS present in the sample reservoir and both reservoirs were at 150 V. The sample waste reservoir was at ground, causing a steady stream of cells and SDS to mix in the double-T region and migrate around the corner toward sample waste (130 V/cm about 0.058±0.007 mm/s for the cells). FIG. 10A shows cells entering from the left, with SDS mixing in from above. In FIG. 10B, the two cells marked 1 and 4 have begun to react with SDS and lyse. The SDS has not diffused across the whole channel, so cells 2 and 3 along the wall are still intact by visual inspection. FIG. 10C shows that the remains of cell 1 have been transported out of view, while the other three marked cells are also now lysed. A total time of 0.3 s elapsed for these three frames.

Example III

Calcium Influx Assay

Calcium influx is involved in major cell functions and responses of lymphocytes. In this assay, the calcium ion influx into the lymphocytes is induced by a calcium releasing agent, calcimycin (A23187, calcium ionophore). The rise in the concentration of free intracellular calcium ions results in an increase in fluorescent signal from cells pre-treated with a fluorescing agent. The kinetic results of calcium influx may be studied with the stop flow method in the microfluidic device.

There are several steps in the study of the process of calcium influx. First, an activator, calcimycin (A23187 calcium ionophore) and the calcium ion complex must adsorb on the cell surface. Second, the complex has to diffuse through the cell membrane. Third, once inside the cytosol, dissociation between the A23187 and calcium ion has to take place. Finally, a fluorescing agent, FLUO-3 AM, complexes with the released calcium and produces emitted light that can be detected (fluorescence).

Reagents and Chemicals

RPMI 1640 without phenol red tissue culture medium and Delbecco's phosphate buffered saline ("PBS") were obtained from Gibco BRL (Burlington, Ontario, Canada). The long-wavelength cytosolic calcium indicator Fluo-3 AM, nonionic detergent PLURONIC F-127, and calcium ionophore A23187 free acid (calcimycin) were obtained form Molecular Probes (Eugene, Oreg.). Human serum albumin (HSA) was obtained from Bayer Corp. (Kankakee, Ill.). The LYMPHOLYTE-poly was obtained from Cedarlane (Hornby, Ontario, Canada). All other chemicals including verapamil, mefenamic acid, fetal calf serum (FCS), D-(+)-glucose, N-2-hydroxyethylpiperazine N'-2-ethanesulfonic acid (HEPES), and ethylenediaminetetraacetic acid (EDTA) were obtained from Sigma Chemical Co. (Oakville, Ontario, Canada).

Preparation and Labeling of Human Lymphocytes

For measurement of calcium influx, a calcium-specific fluorophore, Fluo-3 AM (Molecular Proves), was preloaded into purified human lymphocytes as acetoxymethyl (AM) ester.

Human lymphocytes from venous blood of healthy donors were isolated by LYMPHOLYTE-poly gradient centrifugation as described in Boyum (22). After isolation of mononuclear cells, residual platelets were removed from the cell suspension by resuspending the cell pellet in PBS/3 mM EDTA/1% HSA defined and centrifuged at 800 rpm for 12 minutes. Cells were washed three times with the above procedure. The purified lymphocyte pellet was resuspended in 5.0 ml HEPES buffer without calcium (5 mM KCl, 145 mM NaCl, 1 mM $Na_2HPO_4$, 0.5 mM glucose, 10 mm HEPES, pH 7.4).

A 10 μl sample of Fluo-3 AM solution was diluted into 5.0 ml HEPES buffer without calcium. The 5.0 ml lymphocyte solution was mixed with the 5.0 ml Fluo-3 AM solution to make a 2 μM lymphocyte-Fluo-3 AM labeling solution. The lymphocytes were incubated for 60 minutes at room temperature on a hematology mixer. This Fluo-3 AM labeling procedure was followed as described by Hagar et at. (21).

After lymphocyte labeling, the cells were washed three times with HEPES buffer without calcium. The labeled lymphocytes were suspended at $1 \times 10^7$ cells/ml in RPMI 1640 without phenol red media and kept at 22° C. until needed.

Determination of Mixing Time

To determine the time of mixing at point B in FIG. 7A, a dye, Bengal Rose (5 mM) was introduced into the activator channel (#4) of PCRD1 (FIG. 8) prepared by the method set forth in Example 1. The flow is laminar, and at the flow velocity there is no diffusion of dye into the buffer during transit time. After stop-flow, FIG. 7B shows the extent of diffusion of dye after 0.2 seconds into the buffer. No gradient was visible to the CCD detector after about 0.4 seconds. Simple diffusion estimates indicate that uniform mixing should take less than 1 second. This allows for studies of the kinetics of individual cell processes that are slower than 1 second.

Preparation of the Microfluidic System

5% fetal calf serum ("FCS") in RPMI 1640 without phenol red media (Gibco BRL, Burlington, Ontario, Canada) was either contained in the cell media and/or flushed through the microfluidic system for 30 minutes before use. The FCS coated channels significantly reduced electroosmotic flow. Thus a hydrodynamic flow system, using negative pressure applied by syringe suction, was used for the stop flow method.

Use of the Microfluidic System

Figure 8:
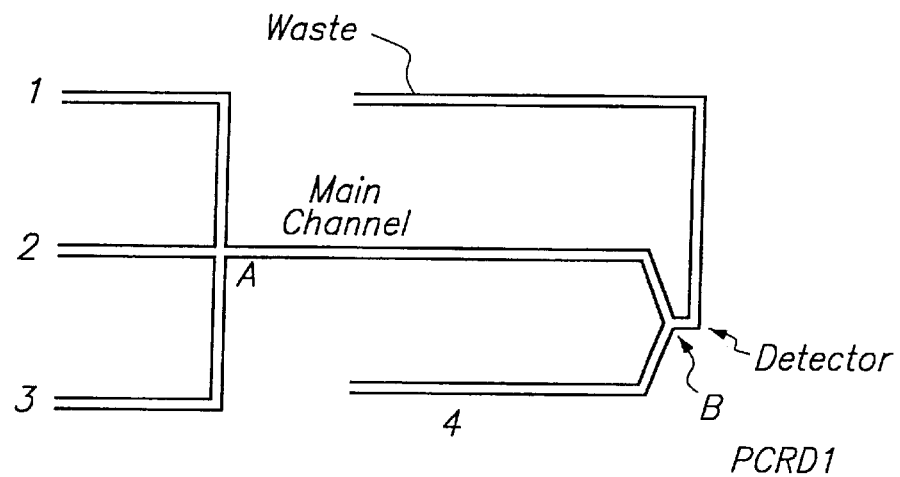
FIG. 8 is a schematic of the design of the PCRD1.
Figure 9:
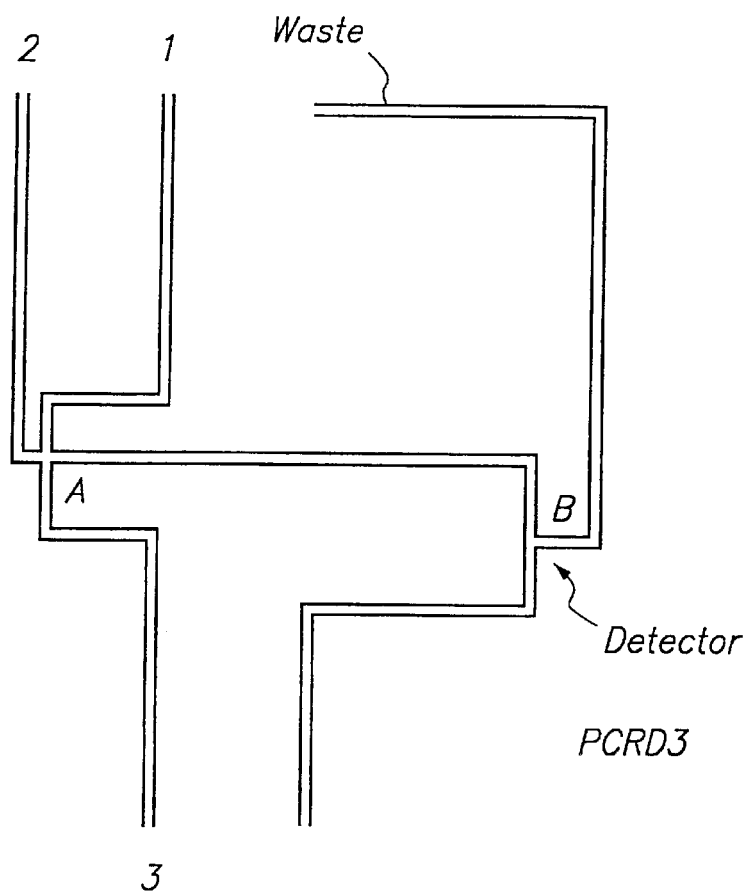
FIG. 9 is a schematic of the design of the PCRD3.

FIGS. 8 and 9 show the layout of the post column device manufactured by the method set forth in Example 1.

With reference to FIG. 8, buffer was added to channels #1 and #2, lymphocytes, prepared as described above, were added to channel #3, and activator A23187 was added to channel #4.

Solvent flow was driven by suction (negative pressure) applied to the waste outlet with a manually operated glass syringe. The negative pressure draws solution from all four inlet reservoirs, with approximately proportionate amounts drawn from the activator reservoir as compared to the other three reservoirs combined.

A fluorescence microscope equipped with a 25× objective and a CCD camera was positioned over the detection zone, point "B" in FIG. 8, allowed the observation of cells as they passed the detection zone. The device was operated in a stop flow mode in which flow was stopped when a single cell entered the detection zone for observation. Stopping the flow allowed the two unmixed zones at the intersection to diffuse into each other, i.e. the main flow path and the activator flow path, beginning cell reaction with the added activator reagent.

After 4 seconds at the mixing point, the lymphocyte showed fluorescence caused by calcium influx upon activation with A23187. The increase in emitted light from non-activated to activated calcium channels in cells has earlier been reported to be between 2 and 40 times depending on cell type and method. The increase in emitted fluorescence observed was typically on the order of 5 to 10 fold. A kinetic plot of the calcium flux on a human lymphocyte is shown in FIG. 12.

The solution in the inhibitor reservoir was replaced with buffer from noninhibited control experiments. Alternatively, for greater flexibility of the process, a second syringe can be placed on the activator reservoir (channel #4) or on the buffer reservoir (channel #1), in order to prevent flow from those channels while the cells are delivered to point "B". This allows for ready implementation of control experiments.

The dual syringe control technique was investigated using the Rose Bengal dye in point "B" on the chip. With reference to FIG. 8, buffer was added to flow paths #1, #2, and #3 and Rose Bengal dye was added to flow path #4. The syringe was connected to the "waste" and flow paths number #4. By changing the back pressure or flow rate, it was possible to control the flow from 0% dye to 100% dye. However, a small back-flow into the "stopped flow" channel was needed to assure "stopped flow" in the channel.

Example IV
Calcium Influx Assay with Lymphocyte Inhibitor

The microfluidic device and human lymphocytes were prepared as described in Example III.

With reference to FIG. 8, 100 $\mu$M of verapamil, an inhibitor, was introduced into channel #1; buffer was introduced into channel #2; leukocytes were introduced into channel #3; and calcium activator A23187 was introduced into channel #4.

The device was run as described in Example III above. Verapamil was introduced to the lymphocytes at point "A" intersection of the device (FIG. 8). The lymphocytes were incubated with verapamil for four minutes while transported through the main channel to the mixing point "B". Observation of the verapamil treated lymphocyte showed no fluorescence. Thus, verapamil caused a significant reduction of activation in calcium flux on the human lymphocytes.

This example was completed on twenty individual lymphocytes and each showed comparable results. The verapamil inhibition was time dependent, as lymphocytes incubated for 30 seconds with verapamil in the mixing channel showed no inhibition.

Example V
Oxidative Burst

The production of superoxide anion $O_2^-$ can be measured using the oxidant-sensitive fluorescent dye, dihydrorhodamine 123 (Molecular Probes). Granulocytes are incubated in the presence of 2 $\mu$M dihydrorhodamine 123 for 20 minutes at 37° C. Labeled cells are then washed and resuspended in PBS. These cells are then analyzed for the induction of the oxidative burst pathway using the microfluidic device as described in Example III. Using stop-flow, single granulocytes are mixed with an activator such as FMLP and the induction of fluorescence is monitored. Similar types of fluorescence based assays may be used for agonists that induce intracellular pH changes or to study programmed cell death.

Example VI
Weir Device

Mice lymphocytes (5×10$^7$) were flushed into the chip with PBS. Two weir devices were used in the microfluidic device. The distance between the weirs in the first device was 1 $\mu$m and in the second device it was 3 $\mu$m. Flow was induced by pressure applied by a syringe.

In both devices the lymphocytes migrated through the weir. When the cells entered the weir they occupied all areas where liquid passes, thereby forming an effective plug that reduced the fluid flow. Higher pressure was then needed to start the cells moving again. This resulted in the cells migrating over the top of the weir.

FIGS. 4A and B show a schematic of a weir-based device for physical trapping of cells fabricated using a two-mask process in glass. The kinetics of calcium uptake and release from a single cell can be followed within these structures.

Example VII
Selectin Binding to Select Channels of a Microfluidic Device

This example shows that selectins can be bound to specific flow paths in the device of the present invention.

The microfluidic flow paths, as shown in FIG. 8 (PCRD1) and FIG. 5B (PCRD2) were first vacuumed to remove dust or debris particles that may lodge in the flow paths and cause blockage. Filtered Dulbecco's phosphate buffered saline (PBS) (Gibco) was added to the flow paths and flushed through with a vacuum for 30 minutes at room temperature. After flushing the microchip, the flow paths were checked for air bubbles. Air bubbles were removed from the flow paths with continued vacuum.

In each experiment, the microfluidic device was incubated for 2 hours at 37° C. during the flow of selectin through the flow paths. After the incubation period, the flow paths were flushed with PBS for 10 minutes under vacuum. 100 $\mu$l of a 1:10 dilution of mouse monoclonal primary antibody (anti-P or E-selectin) was then added to bind to the previously bound selectin. This primary antibody was flushed through the flow paths with back pressure for 1.0 hour. After primary antibody incubation, the flow paths were flushed with PBS. 100 $\mu$l of a 1:10 dilution of secondary antibody (Goat F(ab')$_2$ anti-mouse IgG (H+L)) labeled with fluorescein (Pierce) was then added to the flow paths. The secondary antibody was vacuumed through the flow paths for 15 to 30 minutes at 37° C. After the secondary antibody incubation, the flow paths channels were again flushed with PBS while visualizing the selectin bound flow path under a microscope.

Once the unbound fluorescent secondary antibody was washed away, the bound secondary antibody was visible on the channel walls indicating that the corresponding selectin was bound to the channel wall.

In the first experiment, purified selectin (P or E) was added to the waste outlet of PCRD1 (FIG. 8); the syringe was placed on inlet #4 and the fluid was drawn to inlet #4. Primary antibody was added to the waste outlet and the syringe was placed on inlet #2, and the antibody was drawn to inlet #2. Finally secondary antibody was added to inlets #1, #2, #3, and #4 and the syringe was placed on the waste outlet and the secondary antibody was drawn to the waste outlet. Fluorescence was seen in the waste channel only.

In the second experiment, membrane extracts containing selectins were added to flow paths #1 and #2 and fetal calf serum was added to flow path #3. A syringe was placed on the waste flow path outlet and the selectins and fetal calf serum drawn to the waste outlet. Primary antibody was added to flow paths #1, #2, #3, and #4 and the syringe was placed on the waste flow path outlet and drawn. Secondary antibody was also added to flow paths #1, #2, #3, and #4 and the syringe was placed on the waste flow path outlet and drawn. Fluorescence was seen in paths #1 and #2 but not in paths #3 or #4.

This illustrates that selectins can be added to other flow paths and the area of selectin binding to specific sites on the flow paths controlled.

Example VIII
Cell Rolling

Leukocytes move into tissues under three mechanisms. First, naive leukocytes have a homing response or migration via high endothelial venules into secondary lymphoid tissue.

Second, stimulated leukocytes and/or memory cells display tissue-restricted migration to sites such a mucosal epithelium or skin. Finally, leukocytes as well as neutrophils and monocytes, transmigrate into inflamed tissues in response to localized stimuli. The basic molecular mechanisms of the inflammatory response has been characterized and comprises a cascade of events brought about by the sequential binding of different adhesion receptors. The first step in this adhesion cascade is the reversible binding mediated by selectins. Selectins cause the leukocytes to roll along the inflamed endothelium. During the next phase, a leukocyte activation event mediated by cytokines induces leukocytes to flatten on the endothelium, resulting in transmigration into the tissue. Transmigration depends upon the integrin-ligand binding. It is now recognized that the basic steps of this adhesion cascade and the receptors involved in the process are also used in the trafficking of naive and memory leukocytes.

Conventional rolling cell methods require up to 50 ml of solution per test, or the dosage of an animal in the range of 100 mg/kg. In contrast, a typical drug dosage in the range of 100 $\mu$g/ml of blood would lead to only 1–20 $\mu$g of proto-drug required for tests on hundreds of thousands of cells using this system.

Microfabricated channels can also be used to study cell rolling in one part of the channel and inhibition of rolling in another part of the same channel (e.g., an internal control). This is achieved with a continuous flow, e.g., without the use of stop flow analysis.

FIGS. 12 and 13 depict the device which was used for this experiment. FIG. 12 shows the layout of one of the devices and FIG. 13 depicts the approximate cross-section of one of the channels in the device with the variable measurements corresponding to Table I below. The cross section more properly approximates a trough shape with curved sides and a flat bottom. Table I sets forth the measurements of the variable dimensions for the channels.

TABLE I

| Device | a ($\mu$m) × $10^{-4}$ | b ($\mu$m) × $10^{-4}$ | c ($\mu$m) × $10^{-4}$ | cross section cm$^2$ |
|---|---|---|---|---|
| HCRIVa | 400 | 200 | 100 | 3.00 × $10^{-4}$ |
| HCRIVb | 340 | 200 | 70 | 1.89 × $10^{-4}$ |
| HCRIVc | 300 | 200 | 50 | 1.25 × $10^{-4}$ |
| HCRIVd | 260 | 200 | 30 | 0.69 × $10^{-4}$ |
| HCRIIIa | 350 | 150 | 100 | 2.5 × $10^{-4}$ |
| HCRIIIb | 290 | 150 | 70 | 1.54 × $10^{-4}$ |
| HCRIIIc | 250 | 150 | 50 | 1.00 × $10^{-4}$ |
| HCRIIId | 210 | 150 | 30 | 0.54 × $10^{-4}$ |
| HCRIIa | 300 | 100 | 100 | 2.00 × $10^{-4}$ |
| HCRIIb | 240 | 100 | 70 | 1.19 × $10^{-4}$ |
| HCRIIc | 200 | 100 | 50 | 0.75 × $10^{-4}$ |
| HCRIId | 160 | 100 | 30 | 0.39 × $10^{-4}$ |
| HCRIa | 250 | 50 | 100 | 1.00 × $10^{-4}$ |
| HCRIb | 190 | 50 | 40 | 0.84 × $10^{-4}$ |
| HCRIc | 150 | 50 | 50 | 0.50 × $10^{-4}$ |
| HCRId | 110 | 50 | 30 | 0.24 × $10^{-4}$ |

Conditioning Microfluidic Devices

The microfluidic devices must be conditioned with concentrated nitric acid for one hour before the first use and then before and after each experiment by flushing with 1) concentrated nitric acid for 10 minutes, 2) deionized distilled water for 10 minutes, 3) two molar sulfuric acid for 10 minutes, 4) deionized distilled water for 10 minutes, 5) one molar NaOH for 10 minutes, and 6) deionized distilled water for 10 minutes.

This procedure was determined by conditioning three separate channels, A, B, and C. Channel A was conditioned using steps 1 and 2, channel B was conditioned using steps 1–4, and channel C was conditioned using steps 1–6. Each channel was then coated with selectin and cell rolling was observed. It was found that cell rolling in channel C was more reproducible and occurred to a greater extent than in channels A or B, most likely due to better surface coverage of selectin in channel C.

Flow Rate

Prior to studying cell rolling, it is necessary to study both the flow rate in each channel and the sample delivery from each reservoir.

The flow rate in each channel was calculated based on the measurement of time required in order for a known volume of water to pass through the channel. This was done at different syringe pump rates in order to calibrate the syringe pump. The linear velocity (laminar flow rate) was estimated according to the flowing equation:

$$\text{Flow rate} = (\text{Volume flow rate cm}^3\text{s}^{-1})/\text{cross section of channel cm}^2)$$

The results for the HCRIVa with 100 $\mu$m depth and HCRIVc with 50 $\mu$m depth are shown in Table II below, with optimum values for the specific channel in FIG. 12 in bold:

TABLE II

| Channel | depth ($\mu$m) | total volume ($\mu$l) | pump rate ($\mu$l/min) | Time (s) | flow rate ($\mu$l/min) | linear velocity (mm/s) |
|---|---|---|---|---|---|---|
| A | 100 | 200 | 20 | 460 | 26.08 | 14.49 |
| A | 100 | 400 | 20 | 910 | 26.37 | 14.65 |
| A | 100 | 200 | 10 | 879 | 13.65 | 7.58 |
| A | 100 | 400 | 15 | 1220 | 19.67 | 10.9 |
| A | 100 | 400 | 12.5 | 1465 | 16.38 | 9.1 |
| B | 100 | 400 | 12.5 | 1440 | 16.66 | 9.25 |
| C | 100 | 400 | 12.5 | 1480 | 16.32 | 9.06 |
| A | 50 | 100 | 7.5 | 603 | 9.95 | 13.3 |
| A | 50 | 100 | 4 | 1007 | 5.95 | 8.0 |
| A | 50 | 100 | 2.5 | 1548 | 3.87 | 5.1 |
| B | 50 | 100 | 2.5 | 1413 | 4.25 | 5.6 |
| C | 50 | 100 | 2.5 | 1503 | 3.99 | 5.3 |

Sample Delivery

In order to determine the sample and buffer delivery time for each reservoir, a concentrated solution of Rose Bengal dye in RPMI 1640 (Gibco BRL, Burlington Ont. Canada) was introduced into the first reservoir and RPMI 1640 only was introduced into the second reservoir. The main flow channel was observed under a microscope approximately 1–2 cm past the intersection of the reservoir channels.

When the HCRIVc device was used and the dye was delivered from the right hand reservoir into the channel, and the buffer alone delivered from the left hand reservoir into the channel, the dye covered 150 $\mu$m of the channel, while the buffer covered only 120 $\mu$m of the channel and there was a 30 $\mu$m diffusion zone in the middle of the channel. Accordingly, it is possible to observe two cells rolling within the same channel wherein one cell is exposed to an inhibitor and the other cell is not so exposed. Cells rolling in the middle of the channel (in the diffusion zone) may experience effects from the inhibitor and thus were not counted.

It is further contemplated that a third inlet flow path could be introduced into the device between the first and second inlet flow paths. Buffer could be induced to flow from the third inlet flow path into the main channel. The flow of the buffer would separate the cells from the first inlet flow path from the second inlet flow path.

Cell Rolling of Neutrophils

In preparation for cell rolling, the channels were coated with the desired selectin by methods similar to those set forth in Example VII.

To study cell rolling, two reservoirs leading to one channel were filled with cells. The contents of both the first and second reservoir (cells only) were drawn into the channel and cell rolling was observed. A desired inhibitor was then added to the cells in the second reservoir and the second reservoir was then drawn into the channel such that the stream of cell from the first reservoir and the stream of cells from the second reservoir did not mix at the edges of the channel, but flowed through the channel side by side.

Cell rolling was observed using a P-selectin coated microchip and an E-selectin coated microchip.

1) P-Selectin Coated Chip

Figure 14:
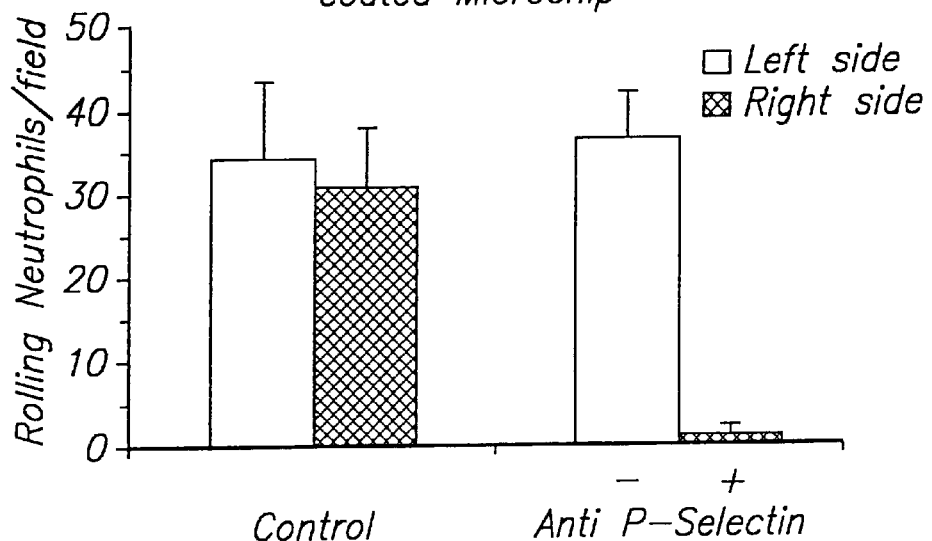
FIG. 14 is a graph of the results of neutrophils rolling on an P-selectin coated microchip.

The HCRIVa microchip was coated with 20 μg/ml P-selectin by methods similar to that described in Example VII and incubated for two hours. Isolated human neutrophils were moved through the rolling microchip with a flow rate of 10 μl/min. (approx. 800/cm shear rate=40 dynes/cm$^2$ shear force). The control results show that the number of neutrophils rolling on both the left and right sides of the P-selectin coated channel under flow. During the flow, the left side of the channel did not receive rolling inhibitor, whereas anti-P-selectin antibody was added to the right reservoir at approximately 1:15:17 and flowed with the cells into the right side of the channel. It was observed that the anti-P-selectin antibody inhibited neutrophil rolling on the P-selectin coated surface on the right side of the channel. The results are shown in graph form in FIG. 14 and are listed in Table III below:

TABLE III

Number of Neutrophils on P-selectin

| Before anti-P-selectin antibody | | | After anti-P-selectin antibody | | |
|---|---|---|---|---|---|
| Time of Day | Left Reservoir Stream (control) | Right Reservoir Stream | Time of Day | Left Reservoir Stream (control) | Right Reservoir Stream |
| 1:07:00 | 23 | 16 | 1:16:20 | 43 | 4 |
| 1:08:00 | 24 | 26 | 1:16:22 | 36 | 2 |
| 1:09:00 | 21 | 31 | 1:16:45 | 32 | 0 |
| 1:10:00 | 31 | 29 | 1:16:48 | 32 | 1 |
| 1:11:00 | 37 | 31 | 1:16:57 | 27 | 0 |
| 1:12:00 | 42 | 29 | 1:17:05 | 45 | 1 |
| 1:13:00 | 40 | 32 | 1:17:14 | 38 | 1 |
| 1:14:00 | 40 | 37 | 1:17:18 | 44 | 1 |
| 1:15:00 | 36 | 43 | 1:17:52 | 35 | 0 |
| 1:15:16 | 46 | 33 | 1:17:55 | 31 | 0 |
| Ave | 34 | 30.7 | Ave | 36.3 | 1 |
| S.D. | 9 | 7 | S.D. | 6 | 1 |

2) E-Selectin Coated Chip

Figure 15:
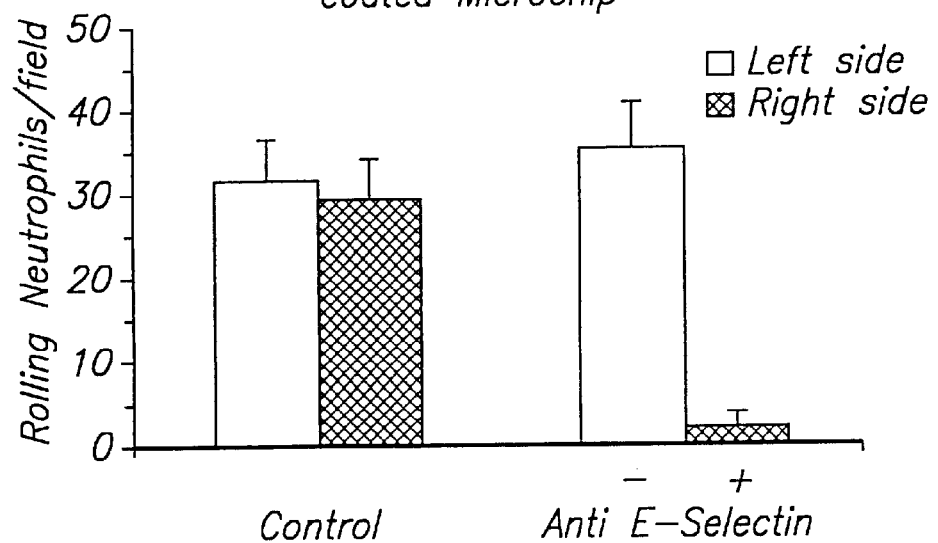
FIG. 15 is a graph of the results of the first trial of neutrophils rolling on an E-selectin coated microchip HCRIV.
Figure 16:
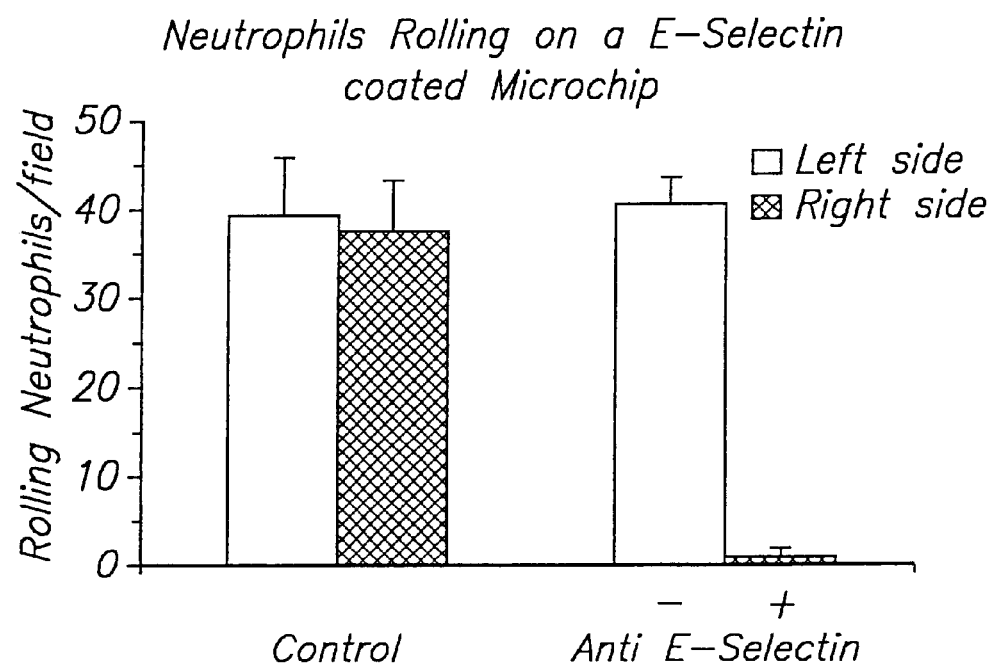
FIG. 16 is a graph of the results of the second trial of neutrophils rolling on an E-selectin coated microchip HCRIV.

A second HCRIVa microchip was coated with 20 μg/ml E-selectin as described in Example VII and incubated for two hours. Isolated human neutrophils were moved through the rolling microchip with a flow rate of 10 μl/min. (approx. 800/cm shear rate=40 dynes/cm$^2$ shear force). The control results show that the number of neutrophils rolling on both the left and right sides of the E-selectin coated channel under flow. In the first run the anti-E-selectin antibody was added to the right reservoir at approximately 1:54:42 and in the second run, the anti-E-selectin antibody was added to the right reservoir at approximately 0:39:30. The results are shown in graph form in FIGS. 15 and 16 and are listed in Tables IV and V below:

TABLE IV

Number of Neutrophils on E-selectin - first run

| Before anti-E-selectin antibody | | | After anti-E-selectin antibody | | |
|---|---|---|---|---|---|
| Time of Day | Left Reservoir Stream (control) | Right Reservoir Stream | Time of Day | Left Reservoir Stream (control) | Right Reservoir Stream |
| 1:44:00 | 27 | 28 | 1:54:42 | 34 | 4 |
| 1:44:38 | 30 | 27 | 1:55:04 | 37 | 4 |
| 1:44:40 | 36 | 31 | 1:55:17 | 37 | 3 |
| 1:44:43 | 40 | 30 | 1:55:30 | 30 | 1 |
| 1:44:45 | 32 | 36 | 1:55:32 | 37 | 0 |
| 1:44:47 | 29 | 37 | 1:55:33 | 38 | 3 |
| 1:44:49 | 40 | 26 | 1:55:35 | 32 | 0 |
| 1:44:51 | 31 | 28 | 1:55:41 | 42 | 0 |
| 1:44:53 | 25 | 25 | 1:55:44 | 34 | 1 |
| 1:44:57 | 31 | 32 | 1:55:46 | 41 | 1 |
| Ave | 32.1 | 30 | Ave | 36.2 | 1.7 |
| S.D. | 5 | 4 | S.D. | 4 | 2 |

TABLE V

Number of Neutrophils on E-selectin - second run

| Before anti-E-selectin antibody | | | After anti-E-selectin antibody | | |
|---|---|---|---|---|---|
| Time of Day | Left Reservoir Stream (control) | Right Reservoir Stream | Time of Day | Left Reservoir Stream (control) | Right Reservoir Stream |
| 0:35:00 | 44 | 36 | 0:39:28 | 39 | 0 |
| 0:36:00 | 33 | 34 | 0:39:31 | 38 | 0 |
| 0:36:42 | 41 | 44 | 0:39:45 | 38 | 0 |
| 0:36:44 | 43 | 32 | 0:39:48 | 44 | 0 |
| 0:36:46 | 49 | 48 | 0:40:26 | 42 | 1 |
| 0:37:00 | 46 | 44 | 0:40:31 | 38 | 1 |
| 0:38:00 | 38 | 33 | 0:40:38 | 44 | 1 |
| 0:37:40 | 34 | 33 | 0:40:53 | 46 | 1 |
| 0:36:47 | 38 | 42 | 0:40:55 | 43 | 1 |
| 0:35:44 | 30 | 33 | 0:40:57 | 39 | 0 |
| Ave | 39.6 | 37.9 | Ave | 41.1 | 0.5 |
| S.D. | 6 | 6 | S.D. | 3 | 1 |

A fresh solution of 1000 μg/ml sialyl Lewis$^x$ was also tested for its ability to inhibit neutrophil rolling in the presence of E-selectin. It was found that sialyl Lewis$^x$ inhibited rolling instantaneously. Fucoidine (Sigma, St. Louis Mo.) in the presence of either E-selectin or P-selectin took a longer time to inhibit rolling of the neutrophils.

Example IX
Cell Rolling Assay with Undiluted Human Blood

Undiluted whole human blood was used in the cell rolling assay described in Example VII above.

This assay was conducted with the HCRIVc device that had a different depth (a=300 μm; b=200 μm; c=50 μm). This device was previously coated either P-selectin or E-selectin as described above. 50 μl heparinated whole human blood (1 mg/ml heparin was added to the blood) was introduced into the first reservoir of the "Y" shape device shown in FIG. 12. The human blood was moved from the reservoir into the channel by a syringe pump at optimum flow rate for the device (see Table II) and the main flow channel, about 1–2 cm from intersection of "Y", was observed under the microscope for 15 minutes.

50 μl of a mixture of inhibitor and heparinated blood was placed into the second reservoir and introduced into the channel for 3–10 minutes. The length of time required to inhibit the rolling of the leukocytes in the whole blood depended upon the inhibitor studied. Anti-E-selectin antibody in the presence of E-selectin or a fresh solution of 1000 µg/ml sialyl Lewis$^x$ in the presence of either E-selectin or P-selectin inhibited leukocyte rolling instantaneously. Fucoidine (Sigma, St. Louis Mo.) in the presence of either E-selectin or P-selectin took a longer time to inhibit rolling of the leukocytes in the whole blood. Cell rolling was seen in the flow from the first reservoir, as compared to the inhibition of rolling seen in the flow from the second reservoir.

The observation of cell rolling may be difficult in whole blood, especially for cells at the bottom of the plates, because of the presence of red blood cells. This problem was solved by using the thinner device (50 µm depth) in which the cell rolling on both top and bottom plates was easily visualized at the same time without difficulty.

Modification of the above-described modes of carrying out various embodiments of this invention will be apparent to those skilled in the art following the teachings of this invention as set forth herein. The examples described above are not limiting, but are merely exemplary of this invention, the scope of which is defined by the following claims.

We claim:

1. A method of observing the effect of one or more candidate compounds on cells in a microfluidic device comprising:
   (a) providing a microfluidic device comprising a main flow path, an outlet, at least two inlet flow paths and a detection zone, wherein at least one inlet flow path intersects and merges with the main flow path at the detection zone;
   (b) applying at least one cell which is capable of flowing in the microfluidic device to a first of the at least two inlet flow paths and a candidate compound to a second of the at least two inlet flow paths;
   (c) inducing flow of the at least one cell and the candidate compound toward the detection zone without mixing;
   (d) stopping the flow of the at least one cell and the candidate compound when the at least one cell and the candidate compound are in the detection zone;
   (e) allowing the at least one cell to mix with the candidate compound in the detection zone; and
   (f) observing the effect of the candidate compound on the at least one cell in the detection zone at the time at least one cell mixes with the candidate compound in the detection zone.

2. The method of claim 1 wherein the candidate compound being studied is an inhibitor, and the cells are lymphocytes.

3. The method of claim 1 wherein the flow paths are coated with a substance selected from the group consisting of proteins, glycoproteins, phospholipids, hydrophilic polymers and hydrophobic polymers.

4. The method of claim 3 wherein the flow path is coated with protein.

5. The method of claim 3 wherein the flow is induced by an electric force.

6. The method of claim 4 wherein the flow is induced by positive or negative fluid pressure.

7. A method of observing the effect of a candidate compound on a cell, the method comprising:
   delivering a cell to a first flow path in a microfluidic device;
   delivering a candidate compound to a second flow path in a microfluidic device;
   inducing flow of the cell and the candidate compound toward a detection zone in the microfluidic device;
   stopping the flow of the cell and the candidate compound at a detection zone in the microfluidic device;
   mixing the cell and the candidate compound at the detection zone; and
   observing an effect of the candidate compound on the cell in the detection zone at the moment the cell mixes with the candidate compound.

* * * * *

UNITED STATES PATENT AND TRADEMARK OFFICE
CERTIFICATE OF CORRECTION

PATENT NO. : 6,900,021 B1
DATED : May 31, 2005
INVENTOR(S) : Harrison et al.

It is certified that error appears in the above-identified patent and that said Letters Patent is hereby corrected as shown below:

Column 4,
Line 59, delete "selecting" and insert -- selectins --.

Column 5,
Line 2, delete "selecting" and insert -- selectins --.

Signed and Sealed this

Twenty-eighth Day of February, 2006

JON W. DUDAS
*Director of the United States Patent and Trademark Office*